(12) United States Patent
Takemori et al.

(10) Patent No.: US 9,242,407 B2
(45) Date of Patent: Jan. 26, 2016

(54) RESIN FOR THERMAL IMPRINTING

(71) Applicants:SCIVAX CORPORATION, Kanagawa (JP); MARUZEN PETROCHEMICAL CO., LTD., Tokyo (JP)

(72) Inventors: Toshifumi Takemori, Tokyo (JP); Yoshiaki Takaya, Chiba (JP); Takahito Mita, Chiba (JP); Tetsuya Iizuka, Chiba (JP); Yuji Hashima, Chiba (JP); Takahisa Kusuura, Chiba (JP); Mitsuru Fujii, Kanagawa (JP); Takuji Taguchi, Kanagawa (JP); Anupam Mitra, Kanagawa (JP)

(73) Assignees: SCIVAX CORPORATION, Kanagawa (JP); MARUZEN PETROCHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/449,661

(22) Filed: Aug. 1, 2014

(65) Prior Publication Data

US 2014/0339735 A1    Nov. 20, 2014

Related U.S. Application Data

(63) Continuation of application No. 12/086,165, filed as application No. PCT/JP2006/324423 on Dec. 7, 2006, now abandoned.

(30) Foreign Application Priority Data

Dec. 9, 2005  (JP) ................................ 2005-357014

(51) Int. Cl.
| | |
|---|---|
| B29C 59/02 | (2006.01) |
| B29C 59/00 | (2006.01) |
| C08F 232/08 | (2006.01) |
| H05K 1/03 | (2006.01) |
| H05K 3/00 | (2006.01) |
| H05K 3/10 | (2006.01) |
| B29K 45/00 | (2006.01) |

(52) U.S. Cl.
CPC ............. B29C 59/005 (2013.01); B29C 59/026 (2013.01); C08F 232/08 (2013.01); H05K 1/032 (2013.01); B29K 2045/00 (2013.01); H05K 3/0014 (2013.01); H05K 3/107 (2013.01); H05K 2201/0158 (2013.01); H05K 2203/0108 (2013.01)

(58) Field of Classification Search
CPC ... B29C 59/005; B29C 59/026; G03F 7/0002; G11B 7/263

USPC .................. 264/446, 447, 129, 134, 135, 293
See application file for complete search history.

(56) References Cited

U.S. PATENT DOCUMENTS

| | | | | | |
|---|---|---|---|---|---|
| 5,439,722 | A | * | 8/1995 | Brekner | ................ C08F 210/02 345/135.1 |
| 2004/0126538 | A1 | * | 7/2004 | Corcoran | .................. B26F 1/24 428/131 |

FOREIGN PATENT DOCUMENTS

| | | | | |
|---|---|---|---|---|
| DE | 10026163 | A1 * | 11/2001 | ............ B29C 47/065 |
| EP | 0800914 | A1 * | 10/1997 | .............. B32B 27/08 |

* cited by examiner

*Primary Examiner* — Timothy Kennedy
(74) *Attorney, Agent, or Firm* — Factor Intellectual Property Law Group, Ltd.

(57) ABSTRACT

A cyclic-olefin-based thermoplastic resin for thermal imprint to be used in the production of a sheet or a film which contains at least one of skeletons represented by the following chemical equation 1 or the following chemical equation 2 in a main chain. The glass transition temperature Tg (° C.) and the value ([M]) of MFR at 260° C. satisfy the following equation 1, and [M]<30. The thermal imprint characteristics (transferability, mold release characteristic, and the like) are superior and the productivity (throughput) is improved.

[Chemical Equation 1]

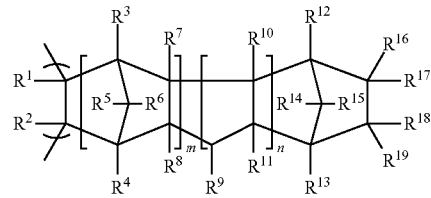

[Chemical Equation 2]

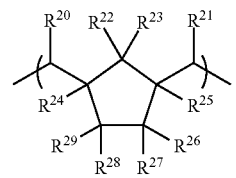

[Equation 1]

$Tg\ (°\ C.) > 219 \times \log[M] - 160$

8 Claims, No Drawings

RESIN FOR THERMAL IMPRINTING

RELATED APPLICATIONS

This application is a continuation of U.S. patent application Ser. No. 12/086,165, filed Jun. 6, 2008, which claims the filing benefit of PCT Patent Application No. PCT/JP2006/324423, filed Dec. 7, 2006; which claims the benefit of Japanese Patent Application No. 2005-357014, filed Dec. 9, 2005; the contents of all of which are incorporated herein by reference.

TECHNICAL FIELD

The present invention relates to a resin for thermal imprint. More specifically, the present invention relates to a cyclic-olefin-based thermoplastic resin which has a specific correlation between a glass transition temperature Tg (° C.) and MFR at 260° C., and can be used for producing a sheet or a film.

BACKGROUND ART

As the optical fields for optical communications, optical disks, displays, optical sensors, and the like dramatically develop, achieving both performance and cost becomes important for optical resin materials. Expectations for transparent resin materials which are easy to process become large in fields of biochips, micro reactors, and the like, in lieu of glasses. In all fields, processing of a base material surface, in particular, microprocessing becomes requisite, and the microprocessing becomes an important technology in a recent semiconductor field where integration becomes remarkable. Conventionally, to form a minute pattern on the surface of a transparent material, schemes of cutting the surface mechanically or of printing a pattern using a resist, a thermo, ultraviolet, or electron radiation curing resin, or the like are used. In particular, to cope up with the present trend and future need for miniaturization of various devices, several different patterning methods are under continuing development. Injection molding has its limitation below 500 μm of film thickness. However, various advanced devices including anti reflecting film or coating requires patterning on a sheet or a film with thickness much below the limit of injection molding.

According to the mechanical cutting, however, there is a problem such that an advanced and complex processing technique is required. According to the pattern printing using a resist or the like, steps thereof are complicated, and there is a problem in the durability, such as peeling of a printed pattern. Further, as patterns become minuter, a mechanism which controls a whole process highly precisely becomes requisite, so that the cost issue becomes not negligible.

To cope with such problems, there is proposed a thermal imprint method for forming a minute pattern at low cost. That is, this is a method of pressing a mold, having a minute pattern heated more than or equal to a glass transition temperature of a resin, against a resin substrate, and of transferring the minute pattern of the mold on the melted resin surface.

Disclosed so far to improve the thermal imprint characteristics (transferability, mold release characteristic, and the like) and the productivity (throughput) are a scheme of providing an insulator to shorten a cycle of temperature rising and cooling (see, for example, Japanese Unexamined Patent Application Laid-open Publication No. 2002-361500), and a scheme of providing an ultrasonic generation mechanism to reduce the melt viscosity by ultrasonic (see, for example, Japanese Unexamined Patent Application Laid-open Publication no. 2004-288811). However, there are few literatures which mentioned materials used for thermal imprint, and development of the materials for thermal imprint is desired.

In general, examples of materials used for thermal imprint are resin materials, glasses, metals, and the like. The resin materials can be molded at a lower temperature in comparison with imprinting to metals or glasses, thus advantageous for the manufacturing cost.

An example of resins is a (meta) acrylic resin represented by polymethacrylic acid (PMMA) or a polycarbonate resin, but have a problem such that the heat resistance is low and size distortion occurs due to water absorption. Further, controlling a balance between the fluidity and the solidification is difficult, so that it is difficult to maintain and use a minutely-transferred pattern (see, for example, Japanese Unexamined Patent Application Laid-open Publication No. 2000-158532).

On the other hand, as a resin having both heat resistance and dimension stability originating from the low water absorption coefficient, there are cyclic-olefin-based thermoplastic resins. In general, the cyclic-olefin-based thermoplastic resins are superior in the transparency, the chemical resistance property, and the low moisture absorption characteristic, and its heat resistance can be easily controlled by the structure of the cyclic-olefin or the contained amount of the cyclic-olefin in the resin. The resin has a low viscosity, and a short relaxation time (time necessary for filling the resin in the pattern of a mold), and is less adhered to the mold, and is superior in the transfer accuracy of a minute pattern, so that application as a thermal imprint material is expected as having a good productivity (see, for example, J. Mater. Chem., 2000, volume 10, page 2634).

See also, Nanoimprint Lithography in Topas, a highly UV-transparent and chemically resistant thermoplast, T. Nielsen, D. Nilsson, et al.

SUMMARY OF THE INVENTION

However, conventional cyclic-olefin-based thermoplastic resins are not ones that the resin properties, such as a glass transition temperature Tg (° C.) and the fluidity are developed for the process of thermal nano-imprint, but require a high molding temperature and a large molding pressure, thus having insufficient thermal imprint characteristics (transferability, mold release characteristic, and the like). Moreover, a long molding time is required, so that the productivity (throughput) is low. For example, one disclosed in the foregoing non-patent literature 1 has a high molding temperature of 240° C., so that it takes a time to cool it down after the pattern of a mold is transferred, and the productivity (throughput) for manufacturing imprint products becomes low. In a non patent literature, as cited in 2, a polymer with a low Glass Transition temperature of 80° C. have been used however, the imprinting is performed at 90° C. above the glass transition temperature of the polymer for 5 min with a pressure of 2000N, making it a process with prolonged cooling time having a low practical or commercial impact, similar to that in citation 1. It is our experience that an optimized polymer for injection molding does not yield well in thermal nanoimprinting or, in other words, an ideal polymer film for thermal nanoimprinting would have to have a different characteristics that that of an ideal polymer for injection molding.

This is primarily because that a correlation between the resin properties, in particular, a glass transition temperature and MFR which becomes the barometer of the fluidity of the resin, and a correlation between an imprint conditions (molding temperature, molding pressure, mold release temperature, and the like) to the resin and the imprint characteristics (transferability, mold release characteristic, and the like) are not figured out.

Therefore, it is an object of the invention to provide a cyclic-olefin-based thermoplastic resin which can be used for manufacturing a sheet or a film like a substrate used for thermal imprint, is superior in thermal imprint characteristics (transferability, mold release characteristic, and the like), and improves a productivity (throughput), and a thermal imprint method using the same.

Means for Solving the Problems

To overcome the above mentioned problem, the present invention enables the development of an ideal polymer for nanoimprinting co-relating the glass transition temperature and MFR of the polymer.

That is, a cyclic-olefin-based thermoplastic resin of the invention is used for producing a sheet or a film, contains at least one of skeletons represented by the following chemical equation 1 or the following chemical equation 2 in a main chain, and wherein a glass transition temperature Tg (° C.) of the resin and a value ([M]) of MFR at 260° C. satisfy the following equation 1, and [M]<30.

[Chemical Equation 1]

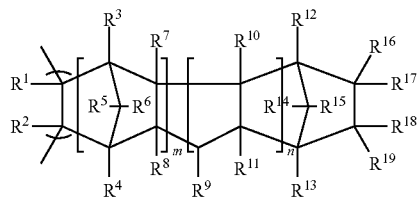

[Chemical Equation 2]

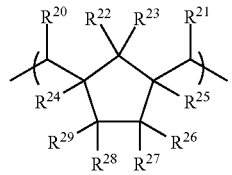

[Equation 1]

$$Tg\ (°\ C.) > 219 \times \log[M] - 160$$

($R^1$ to $R^{29}$ in the chemical equations 1, 2 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0. [M] in equation 1 represents a value of MFR at 260° C.)

Another resin for thermal imprint of the invention is used for producing a sheet or a film, comprises a cyclic-olefin-based thermoplastic resin that contains at least one of skeletons represented by the following chemical equation 3 or the following chemical equation 4 in a main chain, and wherein a glass transition temperature Tg (° C.) of the resin and a value ([M]) of MFR at 260° C. satisfy a following equation 1, and [M]<20 and Tg>90° C.

[Chemical Equation 3]

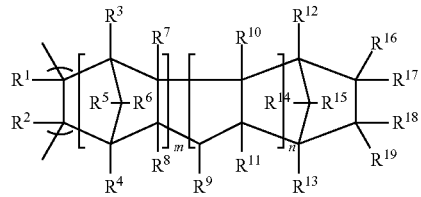

[Chemical Equation 4]

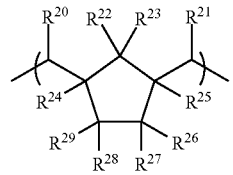

[Equation 1]

$$Tg\ (°\ C.) > 219 \times \log[M] - 160$$

($R^1$ to $R^{29}$ in the chemical equations 3, 4 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0. [M] in equation 1 represents a value of MFR at 260° C.)

In this case, it is preferable that the cyclic-olefin-based thermoplastic resin should comprise a copolymer of cyclic-olefin represented by the following chemical equation 5 and α-olefin, or a polymer produced by hydrogenation after ring-opening polymerization of the cyclic-olefin.

[Chemical Equation 5]

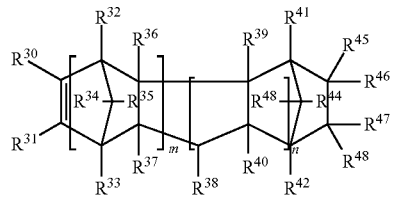

($R^{30}$ to $R^{48}$ in chemical equation 5 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0)

The resin for thermal imprint may contain greater than or equal to one additive. In this case, it is preferable that the additive should contain at least either one of an anti-oxidizing agent or a lubricant.

Further, it is preferable that a resin containing a skeleton represented by the chemical equation 3 is a copolymer of cyclic-olefin represented by the following chemical equation 6 and ethylene.

[Chemical Equation 6]

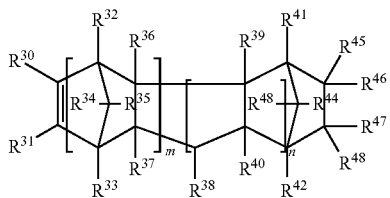

($R^{30}$ to $R^{48}$ in the chemical equation 6 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0)

A thermal imprint method of the invention comprises: pressing a mold, which is heated to less than or equal to a glass transition temperature Tg (° C.) of a resin for thermal imprint+65° C., against a sheet or a film comprising the foregoing resin for thermal imprint, thereby transferring a pattern of the mold.

Another thermal imprint method of the invention comprises steps of: pressing a mold against an injection molded body comprising the foregoing resin for thermal imprint; and releasing the mold from the resin for thermal imprint at a temperature greater than or equal to a glass transition temperature (Tg) of the resin for thermal imprint−25° C.

Other thermal imprint method of the invention comprises: pressing a mold against a sheet or a film comprising the foregoing resin for thermal imprint at less than or equal to 2.5 MPa, thereby transferring a pattern of the mold.

The invention relates to a method of using a cyclic-olefin-based thermoplastic resin for an imprint process, the resin is used for producing a sheet or a film, and contains at least one of skeletons represented by the following chemical equation 7 or the following chemical equation 8 in a main chain, and wherein a glass transition temperature Tg (° C.) of the resin and a value ([M]) of MFR at 260° C. satisfy a following equation 1, and [M]<30.

[Chemical Equation 7]

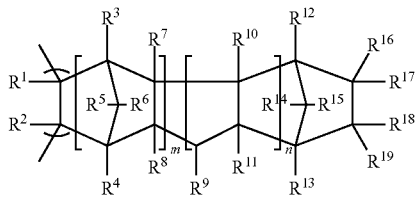

[Chemical Equation 8]

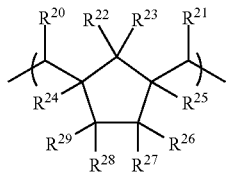

$$\text{Tg (° C.)} > 219 \times \log[M] - 160 \quad \text{[Equation 1]}$$

($R^1$ to $R^{29}$ in the chemical equations 7, 8 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0. [M] in equation 1 represents a value of MFR at 260° C.)

The invention also relates to a method of using a cyclic-olefin-based thermoplastic resin for an imprint process, the resin is used for producing a sheet or a film, and contains at least one of skeletons represented by the following chemical equation 9 or the following chemical equation 10 in a main chain, and wherein a glass transition temperature Tg (° C.) of the resin and a value ([M]) of MFR at 260° C. satisfy a following equation 1, and [M]<20 and Tg>90° C.

[Chemical Equation 9]

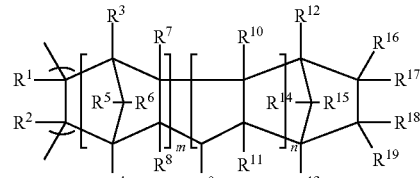

[Chemical Equation 10]

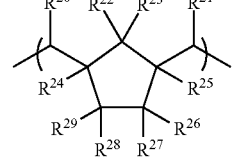

$$\text{Tg (° C.)} > 219 \times \log[M] - 160 \quad \text{[Equation 1]}$$

($R^1$ to $R^{29}$ in the chemical equations 9, 10 may differ or may be same, each of which is a substituent containing a hydrogen atom, a deuterium atom, a hydrocarbon radical having a carbon number of 1 to 15, a halogen atom, and a hetero atom of oxygen, sulfur, or the like, and may form a monocyclic or polycyclic structure with one another. m and n are integers greater than or equal to 0. [M] in equation 1 represents a value of MFR at 260° C.)

Effect of the Invention

Using a cyclic-olefin-based thermoplastic resin, which has a specific correlation between a glass transition temperature Tg (° C.) and MFR at 260° C., enables a thermal imprint at a low temperature and a low pressure, thereby improving the imprint characteristics (transferability, mold release characteristic, and the like) and the productivity (throughput).

Further, by applying imprint conditions (molding temperature, molding pressure, mold release temperature, and the like) to a cyclic-olefin-based thermoplastic resin having a specific correlation between a glass transition temperature Tg (° C.) and MFR at 260° C., the thermal imprint characteristics (transferability, mold release characteristic, and the like) and the productivity (throughput) can be further improved.

DETAILED DESCRIPTION OF THE PRESENT INVENTION

While this invention is susceptible of embodiment in many different forms, there is shown in the drawings and equations, and will herein be described in detail one or more embodiments with the understanding that the present disclosure is to be considered as an exemplification of the principles of the invention and is not intended to limit the invention to the embodiments illustrated.

A cyclic-olefin-based thermoplastic resin to which the invention is applied is a copolymer of cyclic-olefin and α-olefin, i.e., a copolymer with α-olefin containing a repeating unit indicated by a following chemical equation 11 and derived from cyclic-olefin, or a polymer that hydrogen is added to cyclic-olefin indicated by a chemical equation 12 undergone ring-opening polymerization.

[Chemical Equation 11]

[Chemical Equation 12]

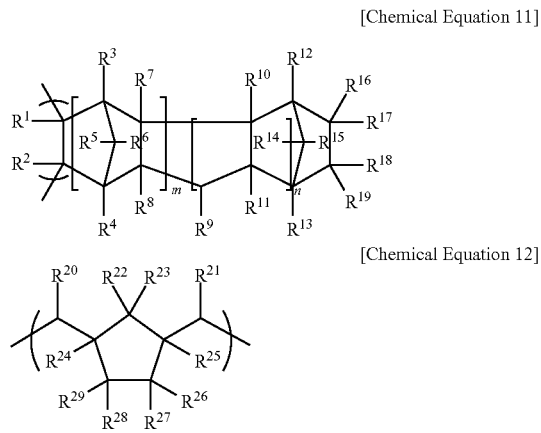

$R^1$ to $R^{29}$ in the chemical equation 11 and the chemical equation 12 may differ, or may be same, and each of which is a substituent containing hydrogen atoms, deuterium atoms, hydrocarbon radical having carbon number of 1 to 15, halogen atoms, or hetero atoms, such as oxygen, or sulfur, and forms a monocyclic or polycyclic structure with one another. Note that m and n are integers greater than or equal to zero.

Cyclic-olefin monomer which constitutes the foregoing resin has a structure indicated by a chemical equation 13, and examples of preferable monomer are, for example, bicyclo[2,2,1]hept-2-ene (norbornene), 5-methylbicyclo[2,2,1]hept-2-ene, 7-methybicyclo[2,2,1]hept-2-ene, 5-ethylbicyclo[2,2,1]hept-2-ene, 5-propylbicyclo[2,2,1]hept-2-ene, 5-n-butylbicyclo[2,2,1]hept-2-ene, 5-isobutylbicyclo[2,2,1]hept-2-ene, 1,4-dimethylbicyclo[2,2,1]hept-2-ene, 5-bromobicyclo[2,2,1]hept-2-ene, 5-chlorobicyclo[2,2,1]hept-2-ene, 5-fluorobicyclo[2,2,1]hept-2-ene, 5,6-dimethylbicyclo[2,2,1]hept-2-ene, dicyclopentadiene, tricyclopentadiene, tetracyclo[4,4,0,1$^{2.5}$,1$^{7.10}$]-3-dodecene, 5,10-dimethyltetracyclo[4,4,0,1$^{2.5}$,1$^{7.10}$]-3-dodecene, 2,10-dimethyltetracyclo[4,4,0,1$^{2.5}$,1$^{7.10}$]-3-dodecene, 11,12-dimethyltetracyclo[4,4,0,1$^{2.5}$,1$^{7.10}$]-3-dodecene, 2,7,9-trimethyltetracyclo[4,4,0,1$^{2.5}$,1$^{7.10}$]-3-dodecene, 9-ethyl-2,7-dimethyltetracyclo[4,4,0,1$^{2.5}$,1$^{7.10}$]-3-dodecene, 9-isobutyl-2,7-dimetyltetracyclo[4,4,0,1$^{2.5}$,1$^{7.10}$]-3-dodecene, 9-isobutyl-2,7-dimethyltetracyclo[4,4,0,1$^{2.5}$,1$^{7.10}$]-3-dodecene, 9,11,12-trimethyltetracyclo[4,4,0,1$^{2.5}$,1$^{7.10}$]-3-dodecene, 9-ethyl-11,12-dimethyltetracyclo[4,4,0,1$^{2.5}$,1$^{7.10}$]-3-dodecene, 9-isobutyl-11,12-dimethyltetracyclo[4,4,0,1$^{2.5}$,1$^{7.10}$]-3-dodecene, 5,8,9,10-tetramethyltetracyclo[4,4,0,1$^{2.5}$,1$^{7.10}$]-3-dodecene, 8-hexyltetracyclo[4,4,0,1$^{2.5}$,1$^{7.10}$]-3-dodecene, 8-stearyltetracyclo[4,4,0,1$^{2.5}$,1$^{7.10}$]-3-dodecene, 8-methyl-9-ethyltetracyclo[4,4,0,1$^{2.5}$,1$^{7.10}$]-3-dodecene, 8-cyclohexyltetracyclo[4,4,0,1$^{2.5}$,1$^{7.10}$]-3-dodecene, 8-ethylidenetetracyclo[4,4,0,1$^{2.5}$,1$^{7.10}$]-3-dodecene, 8-chlorotetracyclo[4,4,0,1$^{2.5}$,1$^{7.10}$]-3-dodecene, 8-bromotetracyclo[4,4,0,1$^{2.5}$,1$^{7.10}$]-3-dodecene, 8-fluorotetracyclo[4,4,0,1$^{2.5}$,1$^{7.10}$]-3-dodecene, 8,9-dichlorotetracyclo[4,4,0,1$^{2.5}$,1$^{7.10}$]-3-dodecene, hexacyclo[6,6,1,1$^{3.6}$,1$^{10.13}$,0$^{2.7}$,0$^{9.14}$]-4-deptadecene, 12-methylhexacyclo[6,6,1,1$^{3.6}$,1$^{10.13}$,0$^{2.7}$,0$^{9.14}$]-4-deptadecene, 12-ethylhexacyclo[6,6,1,1$^{3.6}$,1$^{10.13}$,0$^{2.7}$,0$^{9.14}$]-4-deptadecene, 12-isobutylhexacyclo[6,6,1,1$^{3.6}$,1$^{10.13}$,0$^{2.7}$,0$^{9.14}$]-4-deptadecene, 1,6,10-trimethyl-12-isobutylhexacyclo[6,6,1,1$^{3.6}$,1$^{10.13}$,0$^{2.7}$,0$^{9.14}$]-4-deptadecene, 5-methyl-5-phenyl-bicyclo[2,2,1]hept-2-ene, 5-ethyl-5-phenyl-bicyclo[2,2,1]hept-2-ene, 5-n-propyl-5-phenyl-bicyclo[2,2,1]hept-2-ene, 5-n-butyl-5-phenyl-bicyclo[2,2,1]hept-2-ene, 5,6-dimethyl-5-phenyl-bicyclo[2,2,1]hept-2-ene, 5-methyl-6-ethyl-5-phenylbicyclo[2,2,1]hept-2-ene, 5,6,6-trimethyl-5-phenyl-bicyclo[2,2,1]hept-2-ene, 1,4,5-trimethylbicyclo[2,2,1]hept-2-ene, 5,6-diethyl-5-phenylbicyclo[2,2,1]hept-2-ene, 5-bromo-5-phenyl-bicyclo[2,2,1]hept-2-ene, 5-chloro-5-phenyl-bicyclo[2,2,1]hept-2-ene, 5-fluoro-5-phenyl-bicyclo[2,2,1]hept-2-ene, 5-methyl-5-(tert-butylphenyl)-bicyclo[2,2,1]hept-2-ene, 5-methyl-5-(bromophenyl)-bicyclo[2,2,1]hept-2-ene, 5-methyl-5-(chlorophenyl)-bicyclo[2,2,1]hept-2-ene, 5-methyl-5-(fluorophenyl)-bicyclo[2,2,1]hept-2-ene, 5-methyl-5-(α-naphthyl)-bicyclo[2,2,1]hept-2-ene, 5-methyl-5-antracenyl-bicyclo[2,2,1]hept-2-ene, 8-methyl-8-phenyl-tetracyclo[4,4,0,1$^{2.5}$,1$^{7.10}$]-3-dodecene, 8-ethyl-8-phenyl-tetracyclo[4,4,0,1$^{2.5}$,1$^{7.10}$]-3-dodecene, 8-n-propyl-8-phenyl-tetracyclo[4,4,0,1$^{2.5}$,1$^{7.10}$]-3-dodecene, 8-n-butyl-8-phenyl-tetracyclo[4,4,0,1$^{2.5}$,1$^{7.10}$]-3-dodecene, 8-chloro-8-phenyl-tetracyclo[4,4,0,1$^{2.5}$,1$^{7.10}$]-3-dodecene, 11-methyl-11-phenyl-hexacyclo[6,6,1,1$^{3.6}$,1$^{10.13}$,0$^{2.7}$,0$^{9.14}$]-4-heptadecene, 1,4-methano-4a,9,9-trimethyl-1,4,9a-trihydrofluorene. Such various monomers can be basically made by a thermal Diels-Alder reaction of corresponding dienes and olefins, and adding hydrogen or the like appropriately makes it possible to produce a desired monomer.

[Chemical Equation 13]

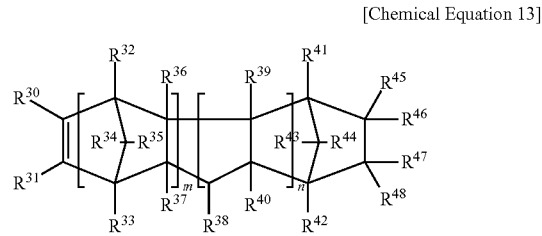

$R^{30}$ to $R^{48}$ in the chemical equation 13 may differ or may be same, and each of which is a substituent including hydrogen atoms, deuterium atoms, hydrocarbon radical having carbon number of 1 to 15, halogen atoms, or hetero atoms, such as oxygen and sulfur, and forms a monocyclic or polycyclic structure with each other. Note that m and n are integers greater than or equal to zero.

An example of α-olefin suitably used for the copolymer indicated by the chemical equation 11 is α-olefin having a carbon number of 2 to 20, preferably, a carbon number of 2 to 10, and includes, for example, ethylene, propylene, 1-butene, 1-pentene, 3-methyl-1-butene, 3-methyl-1-pentene, 1-hexene, 1-octene, 1-decene, and those can be used individually or combined. Ethylene and propylene are preferable in those, and ethylene is particularly preferable from the standpoint of practical aspects, such as copolymer characteristic, and economic efficiency.

In the copolymer indicated by the chemical equation 11, the preferable mole ratio (α-olefin/cyclic-olefin) between the α-olefin and the cyclic-olefin is within a range from 10/90 to 90/10, and further preferably, with in a range from 30/70 to 70/30. The mole ratio in copolymer is decided based on $^{13}$C-NMR (400 MHz, temperature: 120° C./solvent: 1,2,4-trichlorobenzene/1,1,2,2-deuterated tetrachloroethane mixing system).

The thermal imprint resin of the invention is adjusted in such a way that the glass transition temperature Tg (° C.) thereof and a value ([M]) of MFR at 260° C. satisfy the following equation 1.

$$Tg(° C.) > 219 \times \log[M] - 160 \quad \text{[Equation 1]}$$

The weight average molecular weight Mw of the cyclic-olefin-based thermoplastic resin indicated by the chemical equation 11 or the chemical equation 12 is within 10,000 to 1,000,000, preferably, 20,000 to 500,000, and further preferably, 50,000 to 300,000, and the value [M] of MFR at 260° C. is less than or equal to 30, preferably, less than or equal to 20, and further preferably, less than or equal to 10. Accordingly, the strength of the resin becomes high, so that the imprint characteristics (transferability, mold release characteristic, and the like) can be improved without deteriorating the fluidity of the resin.

In considering the application of the resin on which a minute pattern is transferred by thermal imprint, it is preferable that the heat resistance of the resin should be high, and the glass transition temperature should be greater than or equal to 80° C., preferably, greater than or equal to 90° C., and further preferably, higher than the boiling temperature of water, i.e., beyond 100° C. in view of the practicality.

A polymerization method for producing the resin is not limited to any particular ones, and well-known methods, such as a method of coordination polymerization using Ziegler-Natta catalyst or single-site catalyst, and further, causing a copolymer to be subjected to hydrogen addition in accordance with necessity, and a method of adding hydrogen after ring-opening polymerization using metathesis polymerization catalyst. As a method of adding hydrogen, well-known methods can be employed, and this can be carried out using a catalyst containing metal components, such as nickel, and palladium. Examples of the single-site catalyst used for producing the copolymer indicated by, for example, the chemical equation 11 are various kinds of metallocene compounds, and methylene (cyclopentadienyl)(tetracyclopentadienyl)zirconiumdichloride or the like disclosed in, for example, Japanese Unexamined Patent Application Laid-open Publication No. 2003-82017 can be preferably used. A promoter used for a polymerization reaction is not limited to any particular one, but methyl aluminoxanes can be used preferably, and other organic aluminum compounds may coexist and polymerize in accordance with a reaction. Such a polymerization reaction can be preferably carried out within a range from a room temperature (25° C. or so) to 200° C., but it is desirable to carry out such a reaction within a range from 40 to 150° C. in view of the reactivity and the stability of a catalyst. An organic solvent used for a polymerization reaction is not limited to any particular one, and for example, aromatic solvents, such as benzene, toluene, xylene, and ethyl benzene, saturated hydrocarbon solvents, such as hexane, cyclohexane, heptane, methyl cyclohexane, and octane, or a mixed solvent thereof can be preferably used. After the resin is produced, hetero atoms, such as oxygen atoms and sulfur atoms can be arbitrarily introduced by a radical reaction.

In accordance with necessity, greater than or equal to one of additives, such as an anti-oxidizing agent, a heat resistance stabilizer, a weathering stabilizer, a light stabilizer, an anti-static agent, a slipping agent, anti-blocking agent, an anti-fog additive, a lubricant, a color, a pigment, a natural oil, a synthetic oil, and a wax, can be added and mixed, and the mix ratio thereof can be set arbitrarily. Additives (anti-oxidizing agent, lubricant, and the like) are not limited to any particular ones, and well-known compounds can be used preferably.

Additionally, additives like fluorine containing non-ionic surfactant or silicone containing leveling material could be used to reduce surface roughness of a sheet or a film.

According to the invention, addition of an oxidizing agent prevents an oxidization of the resin when heated, a creation of a gel originating from the staining of the resin and a bridge formation of the resin molecular chain, and a deterioration of physical property due to a disconnection of the resin molecular chain.

According to the invention, addition of a lubricant improves the mold release characteristic, after imprint, and the productivity (throughput) of imprint products. Furthermore, there is an effectiveness such that the resin can be easily put into a pattern on a mold when fabricating the resin.

Further, without deteriorating the physical properties required in the application fields of an imprint product, a rubber component can be added to improve the durability of the resin plate, and a well-known compound can be used.

Examples of the applications of the imprint product are optical devices, such as an optical waveguide, a light guiding plate, and a diffraction grating, biochips, fluidic devices, such as a micro flow channel, and a micro reactor, media for saving data, and circuit substrates.

The method of manufacturing a sheet or a film is not limited to any particular one, and a well-known method of the extrusion molding, dipping method, solution casting, spin coating method, or the like can be applied. The thickness can be arbitrarily selected in accordance with an application of an imprint product, and molding is possible if the thickness is less than or equal to 500 µm. The sheet or the film using the thermal imprint resin of the invention can be formed in any shapes, it is preferable that the thickness is less than or equal to 300 µm, and more preferably less than or equal to 150 µm.

Various products can be used as a device for imprinting, and can be selected arbitrarily. Various sizes, such as less than or equal to 100 µm, less than or equal to 50 µm, less than or equal to 10 µm, less than or equal to 1 µm, and less than or equal to 500 nm can be selected as the size of a transferred pattern for the thermal imprint resin of the invention.

Next, an explanation will be given of a method of performing imprinting on a sheet or a film comprising the resin of the invention.

To realize a process having the improved imprint characteristics (transferability, mold release characteristic, and the like), it is preferable to reduce a molding pressure and to shorten the retention time at molding. This is because that if the molding pressure when performing imprinting is too high and the retention time of a pressure is too long, the resin adheres to the mold, so that the pattern is elongated or damaged in mold releasing, and the transfer precision of the pattern is reduced. Specifically, in using a sheet or a film of the resin of the invention, the molding pressure in performing imprinting should be less than or equal to 3.0 MPa, and more preferably, less than or equal to 2.5 MPa. Further, the retention time in performing molding should be less than or equal to 1000 seconds, more preferably, less than or equal to 600 seconds.

The polymer film or sheet could be supported by a substrate of a polymer like poly carbonates, poly acryls, poly imides or graphite or metal like aluminum, stainless steel, etc, during the imprinting process. In case a polymer substrate is used as a support, the glass transition temperature of the said polymer should be higher than the temperature at which the imprinting is performed. In case a film is cast on a substrate of aluminum or silicon, etc, the film on substrate could be used directly.

Further, to realize a process having the improved productivity (throughput), it is preferable to reduce the temperature of the mold, and to shorten the retention time in performing molding. This is because that if the mold temperature is low, the cooling time can be shortened, and if the retention time at which the mold and the sheet or the film are pressed is short, then the molding time can be shortened.

Specifically, it is preferable to use a sheet or a film comprised of the resin of the invention, and to set the temperature in performing molding to less than or equal to the glass transition temperature Tg+80° C., and more preferably, less than or equal to Tg+65° C. It is preferable that the temperatures of the mold in mold releasing and the sheet or the film should be greater than or equal to Tg−40° C., and more preferably, greater than or equal to Tg−25° C.

EXAMPLES

Examples of the invention will be explained below, but the invention should not be limited to the following examples.

Regarding the weight average molecular weight (Mw), the number average molecular weight (Mn), and the molecular weight fractionation (Mw/Mn) of the resin to be used, an GPC device manufactured by Wasters was used by the gel permeation chromatography method (GPC), and those were measured under a condition such that column: K-805L/K-806L manufactured by Shodex, column temperature: 40° C., solvent: chloroform, flow rate: 0.8 ml/minute. The glass transition temperature Tg (° C.) of the resin used was acquired from the heat absorption peak in heat up using a differential scanning calorimeter (model: EXSTAR 6000, DSC 6200) manufactured by SEIKO. Further, regarding the value [M] of MFR at 260° C., the MELT INDEXER (model: L248-2531) manufactured by TECHNOL SEVEN Co., Ltd. was used, and a value measured at a loading of 2.16 kgf.

Film or sheet could be fabricated either by the usage of Labo Plastomill D-2025 from Toyoseiki or by spin coating in a SC-300 spin coater from E.H.C Corporation or by casting using an applicator on a glass plate followed by baking, drying and annealing.

For imprint evaluations, an imprint device (VX-2000N-US) manufactured by SCIVAX was used, and the evaluations were carried out under condition described in the examples, respectively, using a mold of 30 mm by 30 mm. Table 1 shows imprint characteristics inherent to presence/absence of correlations (represented by equation 1) between a structure of a resin or a glass transition temperature Tg (° C.) and MFR at 260° C. For evaluation of imprint characteristics, acquired minute bumpy patterns were observed through an electronic microscope, and if a pattern similar to a mold was well transferred, a circular mark is filled, if a resin adhered to a mold, and a deficit of a pattern was formed, then a triangle mark is filled, and if a pattern failure (insufficient filling, elongation, deficit) was confirmed, then a cross mark is filled if a resin adhered to a mold and there is a deficit or film peeling or overstretch, then a cross mark is filled.

First, an explanation will be given of the production method of a sheet or a film used in the examples and comparative examples. Samples 1 to 8 were sheets or films made of resins which satisfied the foregoing equation 1, and samples 9 and 10 were sheets or films made of resins which did not satisfy the equation 1. Note that polymers used for sheets or films contained an anti-oxidizing agent and a lubricant, as long as any particular explanations will be given for product examples.

Product Example 1

Production of a Sheet or a Film

Ethylene/norbornene copolymer (Tg=134° C., MFR=11 @ 260° C.) was molded by the film molding machine, and a transparent molded body (sample 1) having a thickness of 100 µm was produced.

Product Example 2

Production of a Sheet or a Film

Ethylene/norbornene copolymer (Tg=135° C., MFR=10 @ 260° C.) was molded by the film molding machine, and a transparent molded body (sample 2) having a thickness of 90 µm was produced.

Product Example 3

Production of a Sheet or a Film

Ethylene/norbornene copolymer (Tg=109° C., MFR=16 @ 260° C.) was molded by the film molding machine, and a transparent molded body (sample 3) having a thickness of 100 µm was produced.

Product Example 4

Production of a Sheet or a Film

Hydrogeneration of cyclic-olefin based ring-opening polymer (Tg=138° C., MFR=8 @ 260° C.) was molded by the film molding machine, and a transparent molded body (sample 4) having a thickness of 110 µm was produced.

Product Example 5

Production of a Sheet or a Film

Hydrogeneration of cyclic-olefin based ring-opening polymer (Tg=136° C., MFR=7 @ 260° C.) was molded by the film molding machine, and a transparent molded body (sample 5) having a thickness of 110 µm was produced.

Product Example 6

Production of a Sheet or a Film

Hydrogeneration of cyclic-olefin based ring-opening polymer (Tg=105° C., MFR=9 @ 260° C.) was molded by the film molding machine, and a transparent molded body (sample 6) having a thickness of 100 µm was produced.

Product Example 7

Production of a Sheet or a Film

A solution containing 15 wt % of ethylene/norbornane type copolymer (Tg=135° C. MFR=10@260° C.) in diethyl benzene solvent is spin coated on a silicon wafer (400 rpm×5 s, 2000 rpm×20 s) followed by baking (100° C.×15 min, 150° C.×30 min) and annealing (110° C.×30 min) to produce 1.3 μm thick coating (sample 7)

Product Example 8

Production of a Sheet or a Film

Ethylene/norbornene copolymer (Tg=135° C., MFR=59 @ 260° C.) was molded by the film molding machine, and a transparent molded body (sample 8) having a thickness of 100 μm was produced.

Product Example 9

Production of a Sheet or a Film

Ethylene/norbornene copolymer (Tg=132° C., MFR=51 @ 260° C.) was molded by the film molding machine, and a transparent molded body (sample 9) having a thickness of 90 μm was produced.

Example 1

Evaluation for Imprinting on a Film

Sample 1 was fixed on a plate which was heated to a glass transition temperature Tg−23° C. (i.e., 111° C.), a mold (pattern: pillar, diameter 0.5 μm/depth 1 μm) which was preheated to a molding set temperature Tg+30° C. (i.e., 164° C.) was pressed against the surface of the film at a speed of 100 μm/second, and when the load sensor attached to the upper part of the mold reached 2000 N, it was held for 10 seconds by that load. Thereafter, it was cooled to Tg−23° C. (111° C.) while maintaining the displacement of the mold, and after the completion of cooling, the mold was released from the film at a speed of 10 μm/second. It was observed through an electronic microscope that a good pattern without the elongation and flaking off was transferred.

Example 2

Evaluation for Imprinting on a Film

Sample 1 was fixed on a plate which was heated to a glass transition temperature Tg−23° C. (i.e., 111° C.), a mold (pattern: pillar, diameter 0.75 μm/depth 1 μm) which was preheated to a molding set temperature Tg+30° C. (i.e., 164° C.) was pressed against the surface of the film at a speed of 100 μm/second, and when the load sensor attached to the upper part of the mold reached 2000 N, it was held for 10 seconds by that load. Thereafter, it was cooled to Tg−23° C. (111° C.) while maintaining the displacement of the mold, and after the completion of cooling, the mold was released from the film at a speed of 10 μm/second. It was observed through an electronic microscope that a good pattern without the elongation and flaking off was transferred.

Example 3

Evaluation for Imprinting on a Film

Sample 1 was fixed on a plate which was heated to a glass transition temperature Tg−23° C. (i.e., 111° C.), a mold (pattern: pillar, diameter 1 μm/depth 1 μm) which was preheated to a molding set temperature Tg+30° C. (i.e., 164° C.) was pressed against the surface of the film at a speed of 100 μm/second, and when the load sensor attached to the upper part of the mold reached 2000 N, it was held for 10 seconds by that load. Thereafter, it was cooled to Tg−23° C. (111° C.) while maintaining the displacement of the mold, and after the completion of cooling, the mold was released from the film at a speed of 10 μm/second. It was observed through an electronic microscope that a good pattern without the elongation and flaking off was transferred.

Example 4

Evaluation for Imprinting on a Film

Sample 1 was fixed on a plate which was heated to a glass transition temperature Tg−23° C. (i.e., 111° C.), a mold (pattern: line/space (L/S)=1 μm/1 μm) which was preheated to a molding set temperature Tg+30° C. (i.e., 164° C.) was pressed against the surface of the film at a speed of 100 μm/second, and when the load sensor attached to the upper part of the mold reached 2000 N, it was held for 10 seconds by that load. Thereafter, it was cooled to Tg−23° C. (111° C.) while maintaining the displacement of the mold, and after the completion of cooling, the mold was released from the film at a speed of 10 μm/second. It was observed through an electronic microscope that a good pattern without the elongation and flaking off was transferred.

Example 5

Evaluation for Imprinting on a Film

Sample 1 was fixed on a plate which was heated to a glass transition temperature Tg−23° C. (i.e., 111° C.), a mold (pattern: L/S=1 μm/1 μm) which was preheated to a molding set temperature Tg+35° C. (i.e., 169° C.) was pressed against the surface of the film at a speed of 100 μm/second, and when the load sensor attached to the upper part of the mold reached 500 N, it was held for 10 seconds by that load. Thereafter, it was cooled to Tg−23° C. (111° C.) while maintaining the displacement of the mold, and after the completion of cooling, the mold was released from the film at a speed of 10 μm/second. It was observed through an electronic microscope that a good pattern without the elongation and flaking off was transferred.

Example 6

Evaluation for Imprinting on a Film

Sample 1 was fixed on a plate which was heated to a glass transition temperature Tg−23° C. (i.e., 111° C.), a mold (pattern: L/S=1 μm/1 μm) which was preheated to a molding set temperature Tg+35° C. (i.e., 169° C.) was pressed against the surface of the film at a speed of 100 μm/second, and when the load sensor attached to the upper part of the mold reached 500 N, it was held for 300 seconds by that load. Thereafter, it was cooled to Tg−23° C. (111° C.) while maintaining the displacement of the mold, and after the completion of cooling, the mold was released from the film at a speed of 10 μm/second. It was observed through an electronic microscope that a good pattern without the elongation and flaking off was transferred.

Example 7

Evaluation for Imprinting on a Film

Sample 1 was fixed on a plate which was heated to a glass transition temperature Tg−23° C. (i.e., 111° C.), a mold (pattern: hole, diameter 1 μm/depth 1 μm) which was preheated to a molding set temperature Tg+30° C. (i.e., 164° C.) was pressed against the surface of the film at a speed of 100 μm/second, and when the load sensor attached to the upper part of the mold reached 2000 N, it was held for 10 seconds by that load. Thereafter, it was cooled to Tg−23° C. (111° C.) while maintaining the displacement of the mold, and after the completion of cooling, the mold was released from the film at a speed of 10 μm/second. It was observed through an electronic microscope that a good pattern without the elongation and flaking off was transferred.

Example 8

Evaluation for Imprinting on a Film

Sample 1 was fixed on a plate which was heated to a glass transition temperature Tg−23° C. (i.e., 111° C.), a mold (pattern: hole, diameter 1 μm/depth 1 μm) which was preheated to a molding set temperature Tg+35° C. (i.e., 169° C.) was pressed against the surface of the film at a speed of 100 μm/second, and when the load sensor attached to the upper part of the mold reached 500 N, it was held for 10 seconds by that load. Thereafter, it was cooled to Tg−23° C. (111° C.) while maintaining the displacement of the mold, and after the completion of cooling, the mold was released from the film at a speed of 10 μm/second. It was observed through an electronic microscope that a good pattern without the elongation and flaking off was transferred.

Example 9

Evaluation for Imprinting on a Film

Sample 2 was fixed on a plate which was heated to a glass transition temperature Tg−23° C. (i.e., 112° C.), a mold (pattern: pillar, diameter 0.5 μm/depth 1 μm) which was preheated to a molding set temperature Tg+35° C. (i.e., 170° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that a good pattern without the elongation and flaking off was transferred.

Example 10

Evaluation for Imprinting on a Film

Sample 2 was fixed on a plate which was heated to a glass transition temperature Tg−23° C. (i.e., 112° C.), a mold (pattern: pillar, diameter 0.75 μm/depth 1 μm) which was preheated to a molding set temperature Tg+35° C. (i.e., 170° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that a good pattern without the elongation and flaking off was transferred.

Example 11

Evaluation for Imprinting on a Film

Sample 2 was fixed on a plate which was heated to a glass transition temperature Tg−23° C. (i.e., 112° C.), a mold (pattern: pillar, diameter 1 μm/depth 1 μm) which was preheated to a molding set temperature Tg+35° C. (i.e., 170° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that a good pattern without the elongation and flaking off was transferred.

Example 12

Evaluation for Imprinting on a Film

Sample 2 was fixed on a plate which was heated to a glass transition temperature Tg−23° C. (i.e., 112° C.), a mold (pattern: pillar, diameter 0.5 μm/depth 1 μm) which was preheated to a molding set temperature Tg+35° C. (i.e., 170° C.) was pressed against the surface of the film at a speed of 100 μm/second, and when the load sensor attached to the upper part of the mold reached 500 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that a good pattern without the elongation and flaking off was transferred.

Example 13

Evaluation for Imprinting on a Film

Sample 2 was fixed on a plate which was heated to a glass transition temperature Tg−23° C. (i.e., 112° C.), a mold (pattern: pillar, diameter 0.75 μm/depth 1 μm) which was preheated to a molding set temperature Tg+35° C. (i.e., 170° C.) was pressed against the surface of the film at a speed of 100 μm/second, and when the load sensor attached to the upper part of the mold reached 500 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that a good pattern without the elongation and flaking off was transferred.

Example 14

Evaluation for Imprinting on a Film

Sample 2 was fixed on a plate which was heated to a glass transition temperature Tg−23° C. (i.e., 112° C.), a mold (pattern: L/S=1 μm/1 μm) which was preheated to a molding set temperature Tg+35° C. (i.e., 170° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 µm/second. It was observed through an electronic microscope that a good pattern without the elongation and flaking off was transferred.

Example 15

Evaluation for Imprinting on a Film

Sample 2 was fixed on a plate which was heated to a glass transition temperature Tg−23° C. (i.e., 112° C.), a mold (pattern: L/S=1 µm/1 µm) which was preheated to a molding set temperature Tg+35° C. (i.e., 170° C.) was pressed against the surface of the film at a speed of 100 µm/second, and when the load sensor attached to the upper part of the mold reached 500 N, it was held for 10 seconds by that load. Thereafter, it was cooled to Tg−23° C. (112° C.) while maintaining the displacement of the mold, and after the completion of cooling, the mold was released from the film at a speed of 10 µm/second. It was observed through an electronic microscope that a good pattern without the elongation and flaking off was transferred.

Example 16

Evaluation for Imprinting on a Film

Sample 2 was fixed on a plate which was heated to a glass transition temperature Tg−23° C. (i.e., 112° C.), a mold (pattern: L/S=1 µm/1 µm) which was preheated to a molding set temperature Tg+35° C. (i.e., 170° C.) was pressed against the surface of the film at a speed of 100 µm/second, and when the load sensor attached to the upper part of the mold reached 500 N, it was held for 300 seconds by that load. Thereafter, it was cooled to Tg−23° C. (112° C.) while maintaining the displacement of the mold, and after the completion of cooling, the mold was released from the film at a speed of 10 µm/second. It was observed through an electronic microscope that a good pattern without the elongation and flaking off was transferred.

Example 17

Evaluation for Imprinting on a Film

Sample 2 was fixed on a plate which was heated to a glass transition temperature Tg−23° C. (i.e., 112° C.), a mold (pattern: hole, diameter 1 µm/depth 1 µm) which was preheated to a molding set temperature Tg+35° C. (i.e., 170° C.) was pressed against the surface of the film at a speed of 100 µm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 µm/second. It was observed through an electronic microscope that a good pattern without the elongation and flaking off was transferred.

Example 18

Evaluation for Imprinting on a Film

Sample 2 was fixed on a plate which was heated to a glass transition temperature Tg−23° C. (i.e., 112° C.), a mold (pattern: hole, diameter 1 µm/depth 1 µm) which was preheated to a molding set temperature Tg+35° C. (i.e., 170° C.) was pressed against the surface of the film at a speed of 100 µm/second, and when the load sensor attached to the upper part of the mold reached 500 N, it was held for 10 seconds by that load. Thereafter, it was cooled to Tg−23° C. (112° C.) while maintaining the displacement of the mold, and after the completion of cooling, the mold was released from the film at a speed of 10 µm/second. It was observed through an electronic microscope that a good pattern without the elongation and flaking off was transferred.

Example 19

Evaluation for Imprinting on a Film

Sample 3 was fixed on a plate which was heated to a glass transition temperature Tg−23° C. (i.e., 86° C.), a mold (pattern: pillar, diameter 1 µm/depth 1 µm) which was preheated to a molding set temperature Tg+35° C. (i.e., 144° C.) was pressed against the surface of the film at a speed of 100 µm/second, and when the load sensor attached to the upper part of the mold reached 2000 N, it was held for 10 seconds by that load. Thereafter, it was cooled to Tg−23° C. (86° C.) while maintaining the displacement of the mold, and after the completion of cooling, the mold was released from the film at a speed of 10 µm/second. It was observed through an electronic microscope that a good pattern without the elongation and flaking off was transferred.

Example 20

Evaluation for Imprinting on a Film

Sample 3 was fixed on a plate which was heated to a glass transition temperature Tg−23° C. (i.e., 86° C.), a mold (pattern: pillar, diameter 1 µm/depth 1 µm) which was preheated to a molding set temperature Tg+35° C. (i.e., 144° C.) was pressed against the surface of the film at a speed of 100 µm/second, and when the load sensor attached to the upper part of the mold reached 500 N, it was held for 10 seconds by that load. Thereafter, it was cooled to Tg−23° C. (86° C.) while maintaining the displacement of the mold, and after the completion of cooling, the mold was released from the film at a speed of 10 µm/second. It was observed through an electronic microscope that a good pattern without the elongation and flaking off was transferred.

Example 21

Evaluation for Imprinting on a Film

Sample 3 was fixed on a stainless plate which was heated to a glass transition temperature Tg−5° C. (i.e., 104° C.), a mold (pattern: pillar, diameter 1 µm/depth 1 µm) which was preheated to a molding set temperature Tg+65° C. (i.e., 174° C.) was pressed against the surface of the film at a speed of 100 µm/second, and when the load sensor attached to the upper part of the mold reached 1500 N, it was held for 300 seconds by that load. Thereafter, it was cooled to Tg−5° C. (104° C.) while maintaining the load, and after the completion of cooling, the mold was released from the film at a speed of 10 µm/second. It was observed through an electronic microscope that a good pattern without the elongation and flaking off was transferred.

Example 22

Evaluation for Imprinting on a Film

Sample 3 was fixed on a stainless plate which was heated to a glass transition temperature Tg−5° C. (i.e., 104° C.), a mold (pattern: L/S=1 μm/1 μm) which was preheated to a molding set temperature Tg+65° C. (i.e., 174° C.) was pressed against the surface of the film at a speed of 100 μm/second, and when the load sensor attached to the upper part of the mold reached 1500 N, it was held for 300 seconds by that load. Thereafter, it was cooled to Tg–5° C. (104° C.) while maintaining the load, and after the completion of cooling, the mold was released from the film at a speed of 10 μm/second. It was observed through an electronic microscope that a good pattern without the elongation and flaking off was transferred.

Example 23

Evaluation for Imprinting on a Film

Sample 3 was fixed on a stainless plate which was heated to a glass transition temperature Tg–5° C. (i.e., 104° C.), a mold (pattern: hole, diameter 1 μm/depth 1 μm) which was preheated to a molding set temperature Tg+65° C. (i.e., 174° C.) was pressed against the surface of the film at a speed of 100 μm/second, and when the load sensor attached to the upper part of the mold reached 1500 N, it was held for 300 seconds by that load. Thereafter, it was cooled to Tg–5° C. (104° C.) while maintaining the load, and after the completion of cooling, the mold was released from the film at a speed of 10 μm/second. It was observed through an electronic microscope that a good pattern without the elongation and flaking off was transferred.

Example 24

Evaluation for Imprinting on a Film

Sample 4 was fixed on a plate which was heated to a glass transition temperature Tg–23° C. (i.e., 115° C.), a mold (pattern: pillar, diameter 0.5 μm/depth 1 μm) which was preheated to a molding set temperature Tg+30° C. (i.e., 168° C.) was pressed against the surface of the film at a speed of 100 μm/second, and when the load sensor attached to the upper part of the mold reached 2000 N, it was held for 10 seconds by that load. Thereafter, it was cooled to Tg–23° C. (115° C.) while maintaining the load, and after the completion of cooling, the mold was released from the film at a speed of 10 μm/second. It was observed through an electronic microscope that a good pattern without the elongation and flaking off was transferred.

Example 25

Evaluation for Imprinting on a Film

Sample 4 was fixed on a plate which was heated to a glass transition temperature Tg–23° C. (i.e., 115° C.), a mold (pattern: pillar, diameter 0.75 μm/depth 1 μm) which was preheated to a molding set temperature Tg+30° C. (i.e., 168° C.) was pressed against the surface of the film at a speed of 100 μm/second, and when the load sensor attached to the upper part of the mold reached 2000 N, it was held for 10 seconds by that load. Thereafter, it was cooled to Tg–23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 26

Evaluation for Imprinting on a Film

Sample 4 was fixed on a plate which was heated to a glass transition temperature Tg–23° C. (i.e., 115° C.), a mold (pattern: pillar, diameter 1 μm/depth 1 μm) which was preheated to a molding set temperature Tg+30° C. (i.e., 168° C.) was pressed against the surface of the film at a speed of 100 μm/second, and when the load sensor attached to the upper part of the mold reached 2000 N, it was held for 10 seconds by that load. Thereafter, it was cooled to Tg–23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 27

Evaluation for Imprinting on a Film

Sample 4 was fixed on a plate which was heated to a glass transition temperature Tg–23° C. (i.e., 115° C.), a mold (pattern: pillar, diameter 0.5 μm/depth 1 μm) which was preheated to a molding set temperature Tg+35° C. (i.e., 173° C.) was pressed against the surface of the film at a speed of 100 μm/second, and when the load sensor attached to the upper part of the mold reached 2000 N, it was held for 10 seconds by that load. Thereafter, it was cooled to Tg–23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 28

Evaluation for Imprinting on a Film

Sample 4 was fixed on a plate which was heated to a glass transition temperature Tg–23° C. (i.e., 115° C.), a mold (pattern: pillar, diameter 0.75 μm/depth 1 μm) which was preheated to a molding set temperature Tg+35° C. (i.e., 173° C.) was pressed against the surface of the film at a speed of 100 μm/second, and when the load sensor attached to the upper part of the mold reached 2000 N, it was held for 10 seconds by that load. Thereafter, it was cooled to Tg–23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 29

Evaluation for Imprinting on a Film

Sample 4 was fixed on a plate which was heated to a glass transition temperature Tg–23° C. (i.e., 115° C.), a mold (pattern: pillar, diameter 1 μm/depth 1 μm) which was preheated to a molding set temperature Tg+35° C. (i.e., 173° C.) was pressed against the surface of the film at a speed of 100 μm/second, and when the load sensor attached to the upper part of the mold reached 2000 N, it was held for 10 seconds by that load. Thereafter, it was cooled to Tg–23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 30

Evaluation for Imprinting on a Film

Sample 4 was fixed on a plate which was heated to a glass transition temperature Tg−23° C. (i.e., 115° C.), a mold (pattern: pillar, diameter 0.5 μm/depth 1 μm) which was preheated to a molding set temperature Tg+35° C. (i.e., 173° C.) was pressed against the surface of the film at a speed of 100 μm/second, and when the load sensor attached to the upper part of the mold reached 500 N, it was held for 10 seconds by that load. Thereafter, it was cooled to Tg−23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 31

Evaluation for Imprinting on a Film

Sample 4 was fixed on a plate which was heated to a glass transition temperature Tg 23° C. (i.e., 115° C.), a mold (pattern: pillar, diameter 0.75 μm/depth 1 μm) which was preheated to a molding set temperature Tg+35° C. (i.e., 173° C.) was pressed against the surface of the film at a speed of 100 μm/second, and when the load sensor attached to the upper part of the mold reached 500 N, it was held for 10 seconds by that load. Thereafter, it was cooled to Tg−23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 32

Evaluation for Imprinting on a Film

Sample 4 was fixed on a plate which was heated to a glass transition temperature Tg−23° C. (i.e., 115° C.), a mold (pattern: pillar, diameter 0.5 μm/depth 1 μm) which was preheated to a molding set temperature Tg+15° C. (i.e., 153° C.) was pressed against the surface of the film at a speed of 100 μm/second, and when the load sensor attached to the upper part of the mold reached 2000 N, it was held for 600 seconds by that load. Thereafter, it was cooled to Tg−23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 33

Evaluation for Imprinting on a Film

Sample 4 was fixed on a plate which was heated to a glass transition temperature Tg−23° C. (i.e., 115° C.), a mold (pattern: pillar, diameter 0.75 μm/depth 1 μm) which was preheated to a molding set temperature Tg+15° C. (i.e., 153° C.) was pressed against the surface of the film at a speed of 100 μm/second, and when the load sensor attached to the upper part of the mold reached 2000 N, it was held for 600 seconds by that load. Thereafter, it was cooled to Tg−23° C. (115° C.) while maintaining the displacement of the mold, and after the completion of cooling, the mold was released from the film at a speed of 10 μm/second. It was observed through an electronic microscope that a good pattern without the elongation and flaking off was transferred.

Example 34

Evaluation for Imprinting on a Film

Sample 4 was fixed on a stainless plate which was heated to a glass transition temperature Tg−5° C. (i.e., 133° C.), a mold (pattern: pillar, diameter 0.5 μm/depth 1 μm) which was preheated to a molding set temperature Tg+65° C. (i.e., 203° C.) was pressed against the surface of the film at a speed of 100 μm/second, and when the load sensor attached to the upper part of the mold reached 2000 N, it was held for 300 seconds by that load. Thereafter, it was cooled to Tg−5° C. (133° C.) while maintaining the load, and after the completion of cooling, the mold was released from the film at a speed of 10 μm/second. It was observed through an electronic microscope that a good pattern without the elongation and flaking off was transferred.

Example 35

Evaluation for Imprinting on a Film

Sample 4 was fixed on a stainless plate which was heated to a glass transition temperature Tg−5° C. (i.e., 133° C.), a mold (pattern: pillar, diameter 0.5 μm/depth 1 μm) which was preheated to a molding set temperature Tg+65° C. (i.e., 203° C.) was pressed against the surface of the film at a speed of 100 μm/second, and when the load sensor attached to the upper part of the mold reached 1500 N, it was held for 300 seconds by that load. Thereafter, it was cooled to Tg−5° C. (133° C.) while maintaining the load, and after the completion of cooling, the mold was released from the film at a speed of 10 μm/second. It was observed through an electronic microscope that a good pattern without the elongation and flaking off was transferred.

Example 36

Evaluation for Imprinting on a Film

Sample 4 was fixed on a stainless plate which was heated to a glass transition temperature Tg−5° C. (i.e., 133° C.), a mold (pattern: pillar, diameter 0.5 μm/depth 1 μm) which was preheated to a molding set temperature Tg+55° C. (i.e., 193° C.) was pressed against the surface of the film at a speed of 100 μm/second, and when the load sensor attached to the upper part of the mold reached 1750 N, it was held for 300 seconds by that load. Thereafter, it was cooled to Tg−5° C. (133° C.) while maintaining the load, and after the completion of cooling, the mold was released from the film at a speed of 10 μm/second. It was observed through an electronic microscope that a good pattern without the elongation and flaking off was transferred.

Example 37

Evaluation for Imprinting on a Film

Sample 4 was fixed on a plate which was heated to a glass transition temperature Tg−23° C. (i.e., 115° C.), a mold (pattern: L/S=1 µm/1 µm) which was preheated to a molding set temperature Tg+30° C. (i.e., 168° C.) was pressed against the surface of the film at a speed of 100 µm/second, and when the load sensor attached to the upper part of the mold reached 2000 N, it was held for 10 seconds by that load. Thereafter, it was cooled to Tg−23° C. (115° C.) while maintaining the displacement of the mold, and after the completion of cooling, the mold was released from the film at a speed of 10 µm/second. It was observed through an electronic microscope that a good pattern without the elongation and flaking off was transferred.

Example 38

Evaluation for Imprinting on a Film

Sample 4 was fixed on a plate which was heated to a glass transition temperature Tg−23° C. (i.e., 115° C.), a mold (pattern: L/S=1 µm/1 µm) which was preheated to a molding set temperature Tg+35° C. (i.e., 173° C.) was pressed against the surface of the film at a speed of 100 µm/second, and when the load sensor attached to the upper part of the mold reached 500 N, it was held for 300 seconds by that load. Thereafter, it was cooled to Tg−23° C. (115° C.) while maintaining the displacement of the mold, and after the completion of cooling, the mold was released from the film at a speed of 10 µm/second. It was observed through an electronic microscope that a good pattern without the elongation and flaking off was transferred.

Example 39

Evaluation for Imprinting on a Film

Sample 4 was fixed on a stainless plate which was heated to a glass transition temperature Tg−5° C. (i.e., 133° C.), a mold (pattern: L/S=1 µm/1 µm) which was preheated to a molding set temperature Tg+65° C. (i.e., 203° C.) was pressed against the surface of the film at a speed of 100 µm/second, and when the load sensor attached to the upper part of the mold reached 2000 N, it was held for 300 seconds by that load. Thereafter, it was cooled to Tg−5° C. (133° C.) while maintaining the load, and after the completion of cooling, the mold was released from the film at a speed of 10 µm/second. It was observed through an electronic microscope that a good pattern without the elongation and flaking off was transferred.

Example 40

Evaluation for Imprinting on a Film

Sample 4 was fixed on a stainless plate which was heated to a glass transition temperature Tg−5° C. (i.e., 133° C.), a mold (pattern: L/S=1 µm/1 µm) which was preheated to a molding set temperature Tg+65° C. (i.e., 203° C.) was pressed against the surface of the film at a speed of 100 µm/second, and when the load sensor attached to the upper part of the mold reached 1750 N, it was held for 300 seconds by that load. Thereafter, it was cooled to Tg−5° C. (133° C.) while maintaining the load, and after the completion of cooling, the mold was released from the film at a speed of 10 µm/second. It was observed through an electronic microscope that a good pattern without the elongation and flaking off was transferred.

Example 41

Evaluation for Imprinting on a Film

Sample 4 was fixed on a stainless plate which was heated to a glass transition temperature Tg−5° C. (i.e., 133° C.), a mold (pattern: L/S=1 µm/1 µm) which was preheated to a molding set temperature Tg+55° C. (i.e., 193° C.) was pressed against the surface of the film at a speed of 100 µm/second, and when the load sensor attached to the upper part of the mold reached 1500 N, it was held for 300 seconds by that load. Thereafter, it was cooled to Tg−5° C. (133° C.) while maintaining the load, and after the completion of cooling, the mold was released from the film at a speed of 10 µm/second. It was observed through an electronic microscope that a good pattern without the elongation and flaking off was transferred.

Example 42

Evaluation for Imprinting on a Film

Sample 4 was fixed on a plate which was heated to a glass transition temperature Tg−23° C. (i.e., 115° C.), a mold (pattern: hole, diameter 1 µm/depth 1 µm) which was preheated to a molding set temperature Tg+30° C. (i.e., 168° C.) was pressed against the surface of the film at a speed of 100 µm/second, and when the load sensor attached to the upper part of the mold reached 2000 N, it was held for 10 seconds by that load. Thereafter, it was cooled to Tg−23° C. (115° C.) while maintaining the displacement of the mold, and after the completion of cooling, the mold was released from the film at a speed of 10 µm/second. It was observed through an electronic microscope that a good pattern without the elongation and flaking off was transferred.

Example 43

Evaluation for Imprinting on a Film

Sample 4 was fixed on a plate which was heated to a glass transition temperature Tg−23° C. (i.e., 115° C.), a mold (pattern: hole, diameter 1 µm/depth 1 µm) which was preheated to a molding set temperature Tg+35° C. (i.e., 173° C.) was pressed against the surface of the film at a speed of 100 µm/second, and when the load sensor attached to the upper part of the mold reached 750 N, it was held for 10 seconds by that load. Thereafter, it was cooled to Tg−23° C. (115° C.) while maintaining the displacement of the mold, and after the completion of cooling, the mold was released from the film at a speed of 10 µm/second. It was observed through an electronic microscope that a good pattern without the elongation and flaking off was transferred.

Example 44

Evaluation for Imprinting on a Film

Sample 4 was fixed on a stainless plate which was heated to a glass transition temperature Tg−5° C. (i.e., 133° C.), a mold (pattern: hole, diameter 1 µm/depth 1 µm) which was preheated to a molding set temperature Tg+65° C. (i.e., 203° C.) was pressed against the surface of the film at a speed of 100 µm/second, and when the load sensor attached to the upper part of the mold reached 2000 N, it was held for 300 seconds by that load. Thereafter, it was cooled to Tg−5° C. (133° C.) while maintaining the load, and after the completion of cooling, the mold was released from the film at a speed of 10 µm/second. It was observed through an electronic microscope that a good pattern without the elongation and flaking off was transferred.

Example 45

Evaluation for Imprinting on a Film

Sample 4 was fixed on a stainless plate which was heated to a glass transition temperature Tg−5° C. (i.e., 133° C.), a mold (pattern: hole, diameter 1 μm/depth 1 μm) which was preheated to a molding set temperature Tg+65° C. (i.e., 203° C.) was pressed against the surface of the film at a speed of 100 μm/second, and when the load sensor attached to the upper part of the mold reached 1500 N, it was held for 300 seconds by that load. Thereafter, it was cooled to Tg−5° C. (133° C.) while maintaining the load, and after the completion of cooling, the mold was released from the film at a speed of 10 μm/second. It was observed through an electronic microscope that a good pattern without the elongation and flaking off was transferred.

Example 46

Evaluation for Imprinting on a Film

Sample 4 was fixed on a stainless plate which was heated to a glass transition temperature Tg−5° C. (i.e., 133° C.), a mold (pattern: hole, diameter 1 μm/depth 1 μm) which was preheated to a molding set temperature Tg+55° C. (i.e., 193° C.) was pressed against the surface of the film at a speed of 100 μm/second, and when the load sensor attached to the upper part of the mold reached 1750 N, it was held for 300 seconds by that load. Thereafter, it was cooled to Tg−5° C. (133° C.) while maintaining the load, and after the completion of cooling, the mold was released from the film at a speed of 10 μm/second. It was observed through an electronic microscope that a good pattern without the elongation and flaking off was transferred.

Example 47

Evaluation for Imprinting on a Film

Sample 5 was fixed on a stainless plate which was heated to a glass transition temperature Tg−5° C. (i.e., 131° C.), a mold (pattern: pillar, diameter 0.5 μm/depth 1 μm) which was preheated to a molding set temperature Tg+65° C. (i.e., 201° C.) was pressed against the surface of the film at a speed of 100 μm/second, and when the load sensor attached to the upper part of the mold reached 2000 N, it was held for 300 seconds by that load. Thereafter, it was cooled to Tg−5° C. (131° C.) while maintaining the load, and after the completion of cooling, the mold was released from the film at a speed of 10 μm/second. It was observed through an electronic microscope that a good pattern without the elongation and flaking off was transferred.

Example 48

Evaluation for Imprinting on a Film

Sample 6 was fixed on a plate which was heated to a glass transition temperature Tg−23° C. (i.e., 82° C.), a mold (pattern: pillar, diameter 1 μm/depth 1 μm) which was preheated to a molding set temperature Tg+35° C. (i.e., 140° C.) was pressed against the surface of the film at a speed of 100 μm/second, and when the load sensor attached to the upper part of the mold reached 2000 N, it was held for 10 seconds by that load. Thereafter, it was cooled to Tg−23° C. (82° C.) while maintaining the displacement of the mold, and after the completion of cooling, the mold was released from the film at a speed of 10 μm/second. It was observed through an electronic microscope that a good pattern without the elongation and flaking off was transferred.

Example 49

Evaluation for Imprinting on a Film

Sample 6 was fixed on a plate which was heated to a glass transition temperature Tg−23° C. (i.e., 82° C.), a mold (pattern: pillar, diameter 1 μm/depth 1 μm) which was preheated to a molding set temperature Tg+35° C. (i.e., 140° C.) was pressed against the surface of the film at a speed of 100 μm/second, and when the load sensor attached to the upper part of the mold reached 500 N, it was held for 10 seconds by that load. Thereafter, it was cooled to Tg−23° C. (82° C.) while maintaining the displacement of the mold, and after the completion of cooling, the mold was released from the film at a speed of 10 μm/second. It was observed through an electronic microscope that a good pattern without the elongation and flaking off was transferred.

Example 50

Evaluation for Imprinting on a Film

Sample 6 was fixed on a plate which was heated to a glass transition temperature Tg−23° C. (i.e., 82° C.), a mold (pattern: pillar, diameter 1 μm/depth 1 μm) which was preheated to a molding set temperature Tg+15° C. (i.e., 120° C.) was pressed against the surface of the film at a speed of 100 μm/second, and when the load sensor attached to the upper part of the mold reached 2000 N, it was held for 600 seconds by that load. Thereafter, it was cooled to Tg−23° C. (82° C.) while maintaining the displacement of the mold, and after the completion of cooling, the mold was released from the film at a speed of 10 μm/second. It was observed through an electronic microscope that a good pattern without the elongation and flaking off was transferred.

Example 51

Evaluation for Imprinting on a Film

Sample 6 was fixed on a stainless plate which was heated to a glass transition temperature Tg−5° C. (i.e., 100° C.), a mold (pattern: pillar, diameter 1 μm/depth 1 μm) which was preheated to a molding set temperature Tg+55° C. (i.e., 160° C.) was pressed against the surface of the film at a speed of 100 μm/second, and when the load sensor attached to the upper part of the mold reached 1750 N, it was held for 300 seconds by that load. Thereafter, it was cooled to Tg−5° C. (100° C.) while maintaining the load, and after the completion of cooling, the mold was released from the film at a speed of 10 μm/second. It was observed through an electronic microscope that a good pattern without the elongation and flaking off was transferred.

Example 52

Evaluation for Imprinting on a Film

Sample 6 was fixed on a plate which was heated to a glass transition temperature Tg−23° C. (i.e., 82° C.), a mold (pattern: L/S=1 μm/1 μm) which was preheated to a molding set temperature Tg+35° C. (i.e., 140° C.) was pressed against the surface of the film at a speed of 100 μm/second, and when the load sensor attached to the upper part of the mold reached 2000 N, it was held for 10 seconds by that load. Thereafter, it was cooled to Tg−23° C. (82° C.) while maintaining the displacement of the mold, and after the completion of cooling, the mold was released from the film at a speed of 10 μm/second. It was observed through an electronic microscope that a good pattern without the elongation and flaking off was transferred.

Example 53

Evaluation for Imprinting on a Film

Sample 6 was fixed on a plate which was heated to a glass transition temperature Tg−5° C. (i.e., 100° C.), a mold (pattern: L/S=1 μm/1 μm) which was preheated to a molding set temperature Tg+55° C. (i.e., 160° C.) was pressed against the surface of the film at a speed of 100 μm/second, and when the load sensor attached to the upper part of the mold reached 1750 N, it was held for 300 seconds by that load. Thereafter, it was cooled to Tg−5° C. (100° C.) while maintaining the displacement of the mold, and after the completion of cooling, the mold was released from the film at a speed of 10 μm/second. It was observed through an electronic microscope that a good pattern without the elongation and flaking off was transferred.

Example 54

Evaluation for Imprinting on a Film

Sample 6 was fixed on a plate which was heated to a glass transition temperature Tg−23° C. (i.e., 82° C.), a mold (pattern: hole, diameter 1 μm/depth 1 μm) which was preheated to a molding set temperature Tg+35° C. (i.e., 140° C.) was pressed against the surface of the film at a speed of 100 μm/second, and when the load sensor attached to the upper part of the mold reached 2000 N, it was held for 10 seconds by that load. Thereafter, it was cooled to Tg−23° C. (82° C.) while maintaining the displacement of the mold, and after the completion of cooling, the mold was released from the film at a speed of 10 μm/second. It was observed through an electronic microscope that a good pattern without the elongation and flaking off was transferred.

Example 55

Evaluation for Imprinting on a Film

Sample 6 was fixed on a stainless plate which was heated to a glass transition temperature Tg−5° C. (i.e., 100° C.), a mold (pattern: hole, diameter 1 μm/depth 1 μm) which was preheated to a molding set temperature Tg+55° C. (i.e., 160° C.) was pressed against the surface of the film at a speed of 100 μm/second, and when the load sensor attached to the upper part of the mold reached 1750 N, it was held for 300 seconds by that load. Thereafter, it was cooled to Tg−5° C. (100° C.) while maintaining the load, and after the completion of cooling, the mold was released from the film at a speed of 10 μm/second. It was observed through an electronic microscope that a good pattern without the elongation and flaking off was transferred.

Example 56

Evaluation for Imprinting on a Film

Sample 7 was fixed on a plate which was heated to a glass transition temperature Tg−15° C. (i.e., 120° C.), a mold (pattern: pillar, diameter 1 μm/depth 1 μm) which was preheated to a molding set temperature Tg+35° C. (i.e., 170° C.) was pressed against the surface of the film at a speed of 100 μm/second, and when the load sensor attached to the upper part of the mold reached 2000 N, it was held for 10 seconds by that load. Thereafter, it was cooled to Tg−15° C. (120° C.) while maintaining the displacement of the mold, and after the completion of cooling, the mold was released from the film at a speed of 10 μm/second. It was observed through an electronic microscope that a good pattern without the elongation and flaking off was transferred.

Comparative Example 1

Evaluation for Imprinting on a Film

Sample 8 was fixed on a plate which was heated to a glass transition temperature Tg−23° C. (i.e., 112° C.), a mold (pattern: pillar, diameter 0.5 μm/depth 1 μm) which was preheated to a molding set temperature Tg+30° C. (i.e., 165° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 2

Evaluation for Imprinting on a Film

Sample 8 was fixed on a plate which was heated to a glass transition temperature Tg 23° C. (i.e., 112° C.), a mold (pattern: pillar, diameter 0.75 μm/depth 1 μm) which was preheated to a molding set temperature Tg+30° C. (i.e., 165° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 3

Evaluation for Imprinting on a Film

Sample 8 was fixed on a plate which was heated to a glass transition temperature Tg−23° C. (i.e., 112° C.), a mold (pattern: pillar, diameter 1 μm/depth 1 μm) which was preheated to a molding set temperature Tg+30° C. (i.e., 165° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 4

Evaluation for Imprinting on a Film

Sample 8 was fixed on a plate which was heated to a glass transition temperature Tg−23° C. (i.e., 112° C.), a mold (pattern: pillar, diameter 0.5 μm/depth 1 μm) which was preheated to a molding set temperature Tg+35° C. (i.e., 170° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated and flaked off, so that the pattern was no good.

Comparative Example 5

Evaluation for Imprinting on a Film

Sample 8 was fixed on a plate which was heated to a glass transition temperature Tg−23° C. (i.e., 112° C.), a mold (pattern: pillar, diameter 0.75 μm/depth 1 μm) which was preheated to a molding set temperature Tg+35° C. (i.e., 170° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 6

Evaluation for Imprinting on a Film

Sample 8 was fixed on a plate which was heated to a glass transition temperature Tg−23° C. (i.e., 112° C.), a mold (pattern: pillar, diameter 1 μm/depth 1 μm) which was preheated to a molding set temperature Tg+35° C. (i.e., 170° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 7

Evaluation for Imprinting on a Film

Sample 8 was fixed on a plate which was heated to a glass transition temperature Tg−23° C. (i.e., 112° C.), a mold (pattern: pillar, diameter 0.5 μm/depth 1 μm) which was preheated to a molding set temperature Tg+35° C. (i.e., 170° C.) was pressed against the surface of the film at a speed of 100 μm/second, and when the load sensor attached to the upper part of the mold reached 500 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated and flaked off, so that the pattern was no good.

Comparative Example 8

Evaluation for Imprinting on a Film

Sample 8 was fixed on a plate which was heated to a glass transition temperature Tg−23° C. (i.e., 112° C.), a mold (pattern: pillar, diameter 0.75 μm/depth 1 μm) which was preheated to a molding set temperature Tg+35° C. (i.e., 170° C.) was pressed against the surface of the film at a speed of 100 μm/second, and when the load sensor attached to the upper part of the mold reached 500 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 9

Evaluation for Imprinting on a Film

Sample 8 was fixed on a plate which was heated to a glass transition temperature Tg−23° C. (i.e., 112° C.), a mold (pattern: pillar, diameter 0.5 μm/depth 1 μm) which was preheated to a molding set temperature Tg+15° C. (i.e., 150° C.) was pressed against the surface of the film at a speed of 100 μm/second, and when the load sensor attached to the upper part of the mold reached 2000 N, it was held for 600 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 10

Evaluation for Imprinting on a Film

Sample 8 was fixed on a plate which was heated to a glass transition temperature Tg−23° C. (i.e., 112° C.), a mold (pattern: pillar, diameter 0.75 μm/depth 1 μm) which was preheated to a molding set temperature Tg+15° C. (i.e., 150° C.) was pressed against the surface of the film at a speed of 100 μm/second, and when the load sensor attached to the upper part of the mold reached 2000 N, it was held for 600 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 11

Evaluation for Imprinting on a Film

Sample 8 was fixed on a plate which was heated to a glass transition temperature Tg−23° C. (i.e., 112° C.), a mold (pattern: L/S=1 μm/1 μm) which was preheated to a molding set temperature Tg+30° C. (i.e., 165° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 12

Evaluation for Imprinting on a Film

Sample 8 was fixed on a plate which was heated to a glass transition temperature Tg−23° C. (i.e., 112° C.), a mold (pattern: hole, diameter 1 μm/depth 1 μm) which was preheated to a molding set temperature Tg+30° C. (i.e., 165° C.) was pressed against the surface of the film at a speed of 100 μm/second, and when the load sensor attached to the upper part of the mold reached 2000 N, it was held for 10 seconds by that load. Thereafter, it was cooled to Tg−23° C. (112° C.) while maintaining the displacement of the mold, and after the completion of cooling, the mold was released from the film at a speed of 10 μm/second. It was observed through an electronic microscope that the resin was elongated, so that the pattern was no good.

Comparative Example 13

Evaluation for Imprinting on a Film

Sample 9 was fixed on a stainless plate which was heated to a glass transition temperature Tg−5° C. (i.e., 127° C.), a mold (pattern: pillar, diameter 0.5 μm/depth 1 μm) which was preheated to a molding set temperature Tg+65° C. (i.e., 197° C.) was pressed against the surface of the film at a speed of 100 μm/second, and when the load sensor attached to the upper part of the mold reached 2000 N, it was held for 300 seconds by that load. Thereafter, it was cooled to Tg−5° C. (127° C.) while maintaining the load, and after the completion of cooling, the mold was released from the film at a speed of 10 μm/second. It was observed through an electronic microscope that the resin was elongated and flaked off, so that the pattern was no good.

Comparative Example 14

Evaluation for Imprinting on a Film

Sample 9 was fixed on a stainless plate which was heated to a glass transition temperature Tg−5° C. (i.e., 127° C.), a mold (pattern: pillar, diameter 0.5 μm/depth 1 μm) which was preheated to a molding set temperature Tg+65° C. (i.e., 197° C.) was pressed against the surface of the film at a speed of 100 μm/second, and when the load sensor attached to the upper part of the mold reached 1750 N, it was held for 300 seconds by that load. Thereafter, it was cooled to Tg−5° C. (127° C.) while maintaining the load, and after the completion of cooling, the mold was released from the film at a speed of 10 μm/second. It was observed through an electronic microscope that the resin was elongated and flaked off, so that the pattern was no good.

Comparative Example 15

Evaluation for Imprinting on a Film

Sample 9 was fixed on a stainless plate which was heated to a glass transition temperature Tg−5° C. (i.e., 127° C.), a mold (pattern: pillar, diameter 0.5 μm/depth 1 μm) which was preheated to a molding set temperature Tg+65° C. (i.e., 197° C.) was pressed against the surface of the film at a speed of 100 μm/second, and when the load sensor attached to the upper part of the mold reached 1500 N, it was held for 300 seconds by that load. Thereafter, it was cooled to Tg−5° C. (127° C.) while maintaining the load, and after the completion of cooling, the mold was released from the film at a speed of 10 μm/second. It was observed through an electronic microscope that the resin was elongated and flaked off, so that the pattern was no good.

Comparative Example 16

Evaluation for Imprinting on a Film

Sample 9 was fixed on a stainless plate which was heated to a glass transition temperature Tg−5° C. (i.e., 127° C.), a mold (pattern: pillar, diameter 0.5 μm/depth 1 μm) which was preheated to a molding set temperature Tg+55° C. (i.e., 187° C.) was pressed against the surface of the film at a speed of 100 μm/second, and when the load sensor attached to the upper part of the mold reached 1750 N, it was held for 300 seconds by that load. Thereafter, it was cooled to Tg−5° C. (127° C.) while maintaining the load, and after the completion of cooling, the mold was released from the film at a speed of 10 μm/second. It was observed through an electronic microscope that the resin was elongated and flaked off, so that the pattern was no good.

The above-mentioned results are summarized in Table 1.

TABLE 1

| PATTERN | SIZE | MOLD TEMPERATURE | LOAD | HOLD TIME | SAMPLE1 (Tg = 134° C.) | SAMPLE2 (Tg = 135° C.) | SAMPLE3 (Tg = 109° C.) | SAMPLE4 (Tg = 138° C.) | SAMPLE5 (Tg = 136° C.) |
|---|---|---|---|---|---|---|---|---|---|
| PILLAR | diameter 0.5 μm/ depth 1 μm | Tg + 15 | 2000N | 600 s | — | — | — | ○ (EXAMPLE32) | — |
|  | diameter 0.75 μm/ depth 1 μm |  |  |  | — | — | — | ○ (EXAMPLE33) | — |
|  | diameter 1 μm/ depth 1 μm |  |  |  | — | — | — | — | — |
|  | diameter 0.5 μm/ depth 1 μm | Tg + 30 |  | 10 s | ○ (EXAMPLE1) | — | — | ○ (EXAMPLE24) | — |
|  | diameter 0.75 μm/ depth 1 μm |  |  |  | ○ (EXAMPLE2) | — | — | ○ (EXAMPLE25) | — |
|  | diameter 1 μm/ depth 1 μm |  |  |  | ○ (EXAMPLE3) | — | — | ○ (EXAMPLE26) | — |
|  | diameter 0.5 μm/ depth 1 μm | Tg + 35 | 500N |  | — | ○ (EXAMPLE12) | — | ○ (EXAMPLE30) | — |

TABLE 1-continued

| PATTERN | SIZE | MOLD TEMPERATURE | LOAD | HOLD TIME | SAMPLE6 | SAMPLE7 | SAMPLE8 | SAMPLE9 |
|---|---|---|---|---|---|---|---|---|
| | diameter 0.75 μm/depth 1 μm | | | | — | ○ (EXAMPLE13) | — | ○ (EXAMPLE31) | — |
| | diameter 1 μm/depth 1 μm | | | | — | — | ○ (EXAMPLE20) | — | — |
| | diameter 0.5 μm/depth 1 μm | | 2000N | | — | ○ (EXAMPLE9) | — | ○ (EXAMPLE27) | — |
| | diameter 0.75 μm/depth 1 μm | | | | — | ○ (EXAMPLE10) | — | ○ (EXAMPLE28) | — |
| | diameter 1 μm/depth 1 μm | | | | — | ○ (EXAMPLE11) | ○ (EXAMPLE19) | ○ (EXAMPLE29) | — |
| | diameter 0.5 μm/depth 1 μm | Tg + 55 | 1750N | 300 s | — | — | — | ○ (EXAMPLE35) | — |
| | | Tg + 65 | 1500N | | — | — | — | ○ (EXAMPLE36) | — |
| | | | 1759N | | — | — | — | — | — |
| | | | 2000N | | — | — | — | ○ (EXAMPLE34) | ○ (EXAMPLE47) |
| | diameter 1 μm/depth 1 μm | | 1500N | | — | — | ○ (EXAMPLE21) | — | — |
| L/S | 1 μm/1 μm | Tg + 30 | 2000N | 10 s | ○ (EXAMPLE4) | — | — | ○ (EXAMPLE37) | — |
| | | Tg + 35 | 500N | | ○ (EXAMPLE5) | ○ (EXAMPLE15) | — | — | — |
| | | | | 300 s | ○ (EXAMPLE6) | ○ (EXAMPLE16) | — | ○ (EXAMPLE38) | — |
| | | | 2000N | 10 s | — | ○ (EXAMPLE14) | — | — | — |
| | | Tg + 55 | 1500N | 300 s | — | — | — | ○ (EXAMPLE41) | — |
| | | | 1750N | | — | — | — | — | — |
| | | Tg + 65 | 1500N | | — | — | ○ (EXAMPLE22) | — | — |
| | | | 1750N | | — | — | — | ○ (EXAMPLE40) | — |
| | | | 2000N | | — | — | — | ○ (EXAMPLE39) | — |
| HOLE | diameter 1 μm/depth 1 μm | Tg + 30 | 2000N | 10 s | ○ (EXAMPLE7) | — | — | ○ (EXAMPLE42) | — |
| | | Tg + 35 | 500N | | ○ (EXAMPLE8) | ○ (EXAMPLE18) | — | — | — |
| | | | 750N | | — | — | — | ○ (EXAMPLE43) | — |
| | | | 2000N | | — | ○ (EXAMPLE17) | — | — | — |
| | | Tg + 55 | 1750N | 300 s | — | — | — | ○ (EXAMPLE46) | — |
| | | Tg + 65 | 1500N | | — | — | ○ (EXAMPLE23) | ○ (EXAMPLE45) | — |
| | | | 2000N | | — | — | — | ○ (EXAMPLE44) | — |

| PATTERN | SIZE | MOLD TEMPERATURE | LOAD | HOLD TIME | SAMPLE6 (Tg = 105° C.) | SAMPLE7 (Tg = 135° C.) | SAMPLE8 (Tg = 135° C.) | SAMPLE9 (Tg = 132° C.) |
|---|---|---|---|---|---|---|---|---|
| PILLAR | diameter 0.5 μm/depth 1 μm | Tg + 15 | 2000N | 600 s | — | — | x (COMPARATIVE EXAMPLE9) | — |
| | diameter 0.75 μm/depth 1 μm | | | | — | — | x (COMPARATIVE EXAMPLE10) | — |
| | diameter 1 μm/depth 1 μm | | | | ○ (EXAMPLE50) | — | — | — |
| | diameter 0.5 μm/depth 1 μm | Tg + 30 | | 10 s | — | — | x (COMPARATIVE EXAMPLE1) | — |
| | diameter 0.75 μm/depth 1 μm | | | | — | — | x (COMPARATIVE EXAMPLE2) | — |
| | diameter 1 μm/depth 1 μm | | | | — | — | x (COMPARATIVE EXAMPLE3) | — |
| | diameter 0.5 μm/depth 1 μm | Tg + 35 | 500N | | — | — | x (COMPARATIVE EXAMPLE7) | — |
| | diameter 0.75 μm/depth 1 μm | | | | — | — | x (COMPARATIVE EXAMPLE8) | — |

TABLE 1-continued

| Pattern | Dimensions | Temp | Pressure | Time | Result 1 | Result 2 | Result 3 | Result 4 |
|---|---|---|---|---|---|---|---|---|
| | diameter 1 μm/ depth 1 μm | | | | ○ (EXAMPLE49) | — | — | — |
| | diameter 0.5 μm/ depth 1 μm | | 2000N | | — | — | x (COMPARATIVE EXAMPLE4) | — |
| | diameter 0.75 μm/ depth 1 μm | | | | — | — | x (COMPARATIVE EXAMPLE5) | — |
| | diameter 1 μm/ depth 1 μm | | | | ○ (EXAMPLE48) | ○ (EXAMPLE56) | x (COMPARATIVE EXAMPLE6) | — |
| | diameter 0.5 μm/ depth 1 μm | Tg + 55 | 1750N | 300 s | ○ (EXAMPLE51) | — | — | x (COMPARATIVE EXAMPLE16) |
| | | Tg + 65 | 1500N | | — | — | — | x (COMPARATIVE EXAMPLE15) |
| | | | 1759N | | — | — | — | x (COMPARATIVE EXAMPLE14) |
| | | | 2000N | | — | — | — | x (COMPARATIVE EXAMPLE13) |
| | diameter 1 μm/ depth 1 μm | | 1500N | | — | — | — | — |
| L/S | 1 μm/ 1 μm | Tg + 30 | 2000N | 10 s | — | — | x (COMPARATIVE EXAMPLE11) | — |
| | | Tg + 35 | 500N | | — | — | — | — |
| | | | | 300 s | — | — | — | — |
| | | | 2000N | 10 s | ○ (EXAMPLE52) | — | — | — |
| | | Tg + 55 | 1500N | 300 s | — | — | — | — |
| | | | 1750N | | ○ (EXAMPLE53) | — | — | — |
| | | Tg + 65 | 1500N | | — | — | — | — |
| | | | 1750N | | — | — | — | — |
| | | | 2000N | | — | — | — | — |
| HOLE | diameter 1 μm/ depth 1 μm | Tg + 30 | 2000N | 10 s | — | — | x (COMPARATIVE EXAMPLE12) | — |
| | | Tg + 35 | 500N | | — | — | — | — |
| | | | 750N | | — | — | — | — |
| | | | 2000N | | ○ (EXAMPLE54) | — | — | — |
| | | Tg + 55 | 1750N | 300 s | ○ (EXAMPLE55) | — | — | — |
| | | Tg + 65 | 1500N | | — | — | — | — |
| | | | 2000N | | — | — | — | — |

It becomes apparent from table 1 that the film manufactured from a cyclic-olefin-based thermoplastic resin having a specific correlation (indicated by equation 1) between a glass transition temperature Tg (° C.) and MFR at 260° C. has a superior thermal imprint characteristic at a low temperature and a low pressure, and can provide a good transferred pattern. Furthermore, it becomes apparent that the film manufactured from a cyclic-olefin-based thermoplastic resin which does not have a specific correlation (indicated by equation 1) between a glass transition temperature Tg (° C.) and MFR at 260° C. can't provide a good transferred pattern only because the film formed a stretching or distortion of pattern.

It is again emphasized that the above-described embodiments of the present invention, particularly, any "preferred" embodiments, are possible examples of implementations merely set forth for a clear understanding of the principles of the invention. Many variations and modifications may be made to the above-described embodiments of the invention without substantially departing from the spirit and principles of the invention. All such modifications are intended to be included herein within the spirit of the invention and the scope of protection is only limited by the accompanying claims.

The invention claimed is:

1. A method of using a cyclic-olefin-based thermoplastic resin for an imprint process, the resin being used for producing a film by spin coating method, and containing at least one of skeletons represented by a chemical equation 9 or a chemical equation 10 in a main chain, and wherein:

a glass transition temperature Tg (° C.) of the resin and a value ([M]) of MFR at 260° C. satisfy a equation 1; and $[M] < 20$ and $Tg > 90°$ C.

and wherein the chemical equation 9 is represented by:

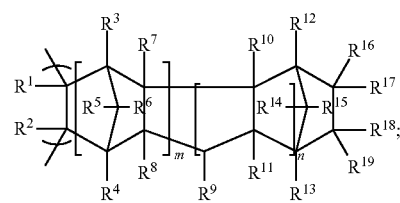

the chemical equation 10 is represented by:

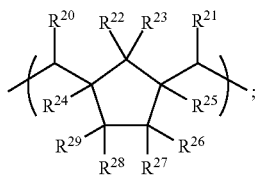

and the equation 1 is:

$$Tg(°C.) > 219 \times \log[M] - 160;$$

and further wherein $R^1$ to $R^{29}$ in chemical equation 9 and chemical equation 10 may differ or may be same, each of which is a substituent containing a hydrogen atom, a deuterium atom, a hydrocarbon radical having a carbon number of 1 to 15, a halogen atom, or a hetero atom of oxygen, sulfur, or the like, and may form a monocyclic or polycyclic structure with one another;

m and n are integers greater than or equal to 0; and,

[M] in equation 1 represents a value of MFR at 260° C.

2. A thermal imprint method comprising:
manufacturing a film comprising a resin for thermal imprint by spin coating method; and
pressing a mold, which is heated to a temperature less than or equal to a glass transition temperature Tg (° C.) of the resin for thermal imprint+65° C., against the film thereby transferring a micrometer- or nanometer-scale pattern of the mold;

wherein the resin comprise a cyclic-olefin-based thermoplastic resin that contains at least one of skeletons, represented by a chemical equation 3 or a chemical equation 4, in a main chain;

a glass transition temperature Tg (° C.) of the resin and a value ([M]) of MFR at 260° C. satisfy a following equation 1; and $$[M] < 20 \text{ and } Tg > 90° C.;$$

and wherein the chemical equation 3 is represented by:

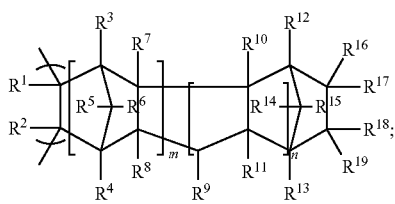

the chemical equation 4 is represented by:

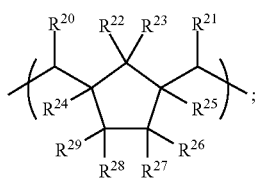

and the equation 1 is:

$$Tg(°C.) > 219 \times \log[M] - 160;$$

and further, wherein $R^1$ to $R^{29}$ in chemical equation 3 and chemical equation 4 may differ or may be same, each of which is a substituent containing a hydrogen atom, a deuterium atom, a hydrocarbon radical having a carbon number of 1 to 15, a halogen atom, or a hetero atom of oxygen, sulfur, or the like, and may form a monocyclic or polycyclic structure with one another;

m and n are integers greater than or equal to 0; and,

[M] in equation 1 represents a value of MFR at 260° C.

3. A thermal imprint method comprising steps of:
manufacturing a film comprising a resin for thermal imprint by spin coating method;
pressing a mold against the film; and
releasing the mold from the resin for thermal imprint at a temperature greater than or equal to a glass transition temperature (Tg) of the resin for thermal imprint–25° C.;

wherein the resin comprise a cyclic-olefin-based thermoplastic resin that contains at least one of skeletons, represented by a chemical equation 3 or a chemical equation 4, in a main chain;

a glass transition temperature Tg (° C.) of the resin and a value ([M]) of MFR at 260° C. satisfy a following equation 1; and $$[M] < 20 \text{ and } Tg > 90° C.;$$

and wherein the chemical equation 3 is represented by:

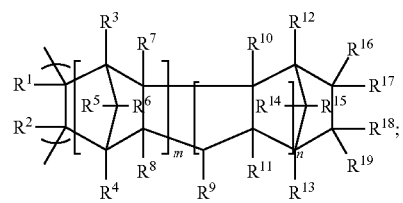

the chemical equation 4 is represented by:

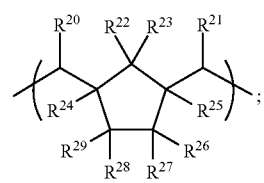

and the equation 1 is:

$$Tg(°C.) > 219 \times \log[M] - 160;$$

and further, wherein $R^1$ to $R^{29}$ in chemical equation 3 and chemical equation 4 may differ or may be same, each of which is a substituent containing a hydrogen atom, a deuterium atom, a hydrocarbon radical having a carbon number of 1 to 15, a halogen atom, or a hetero atom of oxygen, sulfur, or the like, and may form a monocyclic or polycyclic structure with one another;

m and n are integers greater than or equal to 0; and,

[M] in equation 1 represents a value of MFR at 260° C.

4. A thermal imprint method comprising steps of:
manufacturing a film comprising a resin for thermal imprint by spin coating method;
pressing a mold against the film at less than or equal to 2.5 MPa, thereby transferring a micrometer- or nanometer-scale pattern of the mold;

wherein the resin comprise a cyclic-olefin-based thermoplastic resin that contains at least one of skeletons, represented by a chemical equation 3 or a chemical equation 4, in a main chain;

a glass transition temperature Tg (° C.) of the resin and a value ([M]) of MFR at 260° C. satisfy a following equation 1; and $[M]<20$ and $Tg>90°$ C.;

and wherein the chemical equation 3 is represented by:

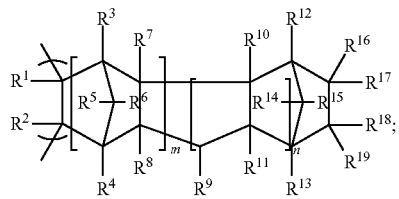

the chemical equation 4 is represented by:

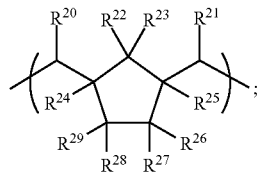

and the equation 1 is:

$Tg(° C.)>219\times\log[M]-160$;

and further, wherein $R^1$ to $R^{29}$ in chemical equation 3 and chemical equation 4 may differ or may be same, each of which is a substituent containing a hydrogen atom, a deuterium atom, a hydrocarbon radical having a carbon number of 1 to 15, a halogen atom, or a hetero atom of oxygen, sulfur, or the like, and may form a monocyclic or polycyclic structure with one another;

m and n are integers greater than or equal to 0; and,

[M] in equation 1 represents a value of MFR at 260° C.

5. The method of claim 1, wherein the cyclic-olefin-based thermoplastic resin is a copolymer of at least one cyclic-olefin represented by a chemical equation 5 and α-olefin, or a polymer produced by hydrogenation after ring-opening polymerization of the cyclic-olefin;

wherein chemical equation 5 is represented by:

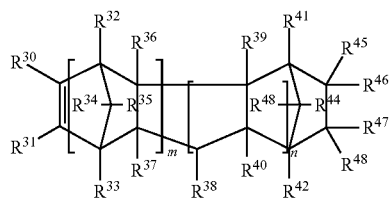

and further wherein $R^{30}$ to $R^{48}$ in chemical equation 5 may differ or may be same, each of which is a substituent containing a hydrogen atom, a deuterium atom, a hydrocarbon radical having a carbon number of 1 to 15, a halogen atom, or a hetero atom of oxygen, sulfur, or the like, and may form a monocyclic or polycyclic structure with one another; and, m and n are integers greater than or equal to 0.

6. The method of claim 2, wherein the cyclic-olefin-based thermoplastic resin is a copolymer of at least one cyclic-olefin represented by a chemical equation 5 and α-olefin, or a polymer produced by hydrogenation after ring-opening polymerization of the cyclic-olefin;

wherein chemical equation 5 is represented by:

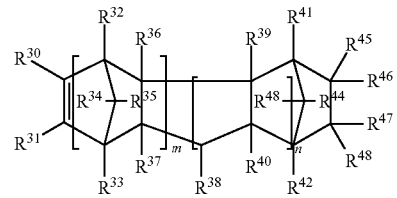

and further wherein $R^{30}$ to $R^{48}$ in chemical equation 5 may differ or may be same, each of which is a substituent containing a hydrogen atom, a deuterium atom, a hydrocarbon radical having a carbon number of 1 to 15, a halogen atom, or a hetero atom of oxygen, sulfur, or the like, and may form a monocyclic or polycyclic structure with one another; and, m and n are integers greater than or equal to 0.

7. The method of claim 3, wherein the cyclic-olefin-based thermoplastic resin is a copolymer of at least one cyclic-olefin represented by a chemical equation 5 and α-olefin, or a polymer produced by hydrogenation after ring-opening polymerization of the cyclic-olefin;

wherein chemical equation 5 is represented by:

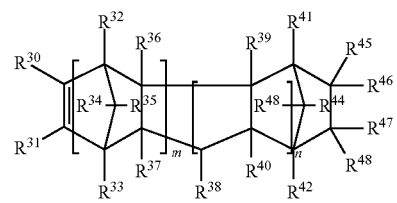

and further wherein $R^{30}$ to $R^{48}$ in chemical equation 5 may differ or may be same, each of which is a substituent containing a hydrogen atom, a deuterium atom, a hydrocarbon radical having a carbon number of 1 to 15, a halogen atom, or a hetero atom of oxygen, sulfur, or the like, and may form a monocyclic or polycyclic structure with one another; and, m and n are integers greater than or equal to 0.

8. The method of claim 4, wherein the cyclic-olefin-based thermoplastic resin is a copolymer of at least one cyclic-olefin represented by a chemical equation 5 and α-olefin, or a polymer produced by hydrogenation after ring-opening polymerization of the cyclic-olefin;

wherein chemical equation 5 is represented by:

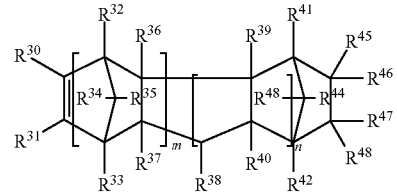

and further wherein $R^{30}$ to $R^{48}$ in chemical equation 5 may differ or may be same, each of which is a substituent containing a hydrogen atom, a deuterium atom, a hydrocarbon radical having a carbon number of 1 to 15, a halogen atom, or a hetero atom of oxygen, sulfur, or the like, and may form a monocyclic or polycyclic structure with one another; and, m and n are integers greater than or equal to 0.

\* \* \* \* \*